(12) United States Patent
Lee et al.

(10) Patent No.: US 11,482,568 B2
(45) Date of Patent: Oct. 25, 2022

(54) FLEXIBLE LIGHTING DEVICE AND DISPLAY PANEL USING MICRO LED CHIPS

(71) Applicant: LUMENS CO., LTD., Yongin-si (KR)

(72) Inventors: Jeongwoo Lee, Yongin-si (KR); Junhyung Lim, Yongin-si (KR); Hyunpyo Hong, Yongin-si (KR); Jihye Chang, Yongin-si (KR); Bogyun Kim, Yongin-si (KR); Youngkyo Ro, Yongin-si (KR); Gunha Kim, Yongin-si (KR); Jugyeong Mun, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 179 days.

(21) Appl. No.: 17/254,250

(22) PCT Filed: Jun. 17, 2019

(86) PCT No.: PCT/KR2019/007250
§ 371 (c)(1),
(2) Date: Dec. 18, 2020

(87) PCT Pub. No.: WO2020/004845
PCT Pub. Date: Jan. 2, 2020

(65) Prior Publication Data
US 2021/0265328 A1    Aug. 26, 2021

(30) Foreign Application Priority Data

Jun. 28, 2018  (KR) .................. 10-2018-0074420
Aug. 1, 2018   (KR) .................. 10-2018-0089721
(Continued)

(51) Int. Cl.
*H01L 27/15*     (2006.01)
*H01L 23/538*    (2006.01)
(Continued)

(52) U.S. Cl.
CPC ........ *H01L 27/156* (2013.01); *H01L 23/5387* (2013.01); *H01L 25/13* (2013.01);
(Continued)

(58) Field of Classification Search
CPC ....... H01L 27/156; H01L 33/52; H01L 33/44; H01L 25/13; H01L 23/5387; H01L 33/58; H01L 33/60; H01L 2933/0058
See application file for complete search history.

(56) References Cited

U.S. PATENT DOCUMENTS

2014/0306244 A1    10/2014  Oraw et al.
2017/0040306 A1     2/2017  Kim et al.
2018/0190747 A1*    7/2018  Son .................... G09G 3/32

FOREIGN PATENT DOCUMENTS

EP     2128845 A1      2/2009
JP     2006-173622 A   6/2006
(Continued)

*Primary Examiner* — Feifei Yeung Lopez
(74) *Attorney, Agent, or Firm* — Mei & Mark LLP

(57) ABSTRACT

A flexible surface lighting device is disclosed. The flexible surface lighting device includes: a flexible substrate including an upper insulating film, a lower insulating film, and a thin metal layer interposed between the upper and lower insulating films; a plurality of micro-LED chips two-dimensionally arrayed on the top surface of the flexible substrate; and a flexible light-transmitting resin part disposed on the top surface of the flexible substrate to cover the top and side surfaces of the micro-LED chips. The flexible substrate includes a white reflective layer in contact with the light-transmitting resin part on the upper insulating film.

20 Claims, 22 Drawing Sheets

(30) Foreign Application Priority Data

Aug. 6, 2018 (KR) .......................... 10-2018-0091312
Nov. 6, 2018 (KR) .......................... 10-2018-0134860

(51) Int. Cl.
*H01L 25/13* (2006.01)
*H01L 33/58* (2010.01)
*H01L 33/60* (2010.01)
*H01L 33/62* (2010.01)
*H01L 33/64* (2010.01)
*H01L 33/52* (2010.01)
*H01L 33/44* (2010.01)

(52) U.S. Cl.
CPC .............. *H01L 33/44* (2013.01); *H01L 33/52* (2013.01); *H01L 33/58* (2013.01); *H01L 33/60* (2013.01); *H01L 33/62* (2013.01); *H01L 33/642* (2013.01); *H01L 2933/0058* (2013.01); *H01L 2933/0066* (2013.01); *H01L 2933/0075* (2013.01)

(56) References Cited

FOREIGN PATENT DOCUMENTS

| | | |
|---|---|---|
| JP | 2008-089945 A | 4/2008 |
| JP | 2014-179319 A | 9/2014 |
| KR | 20-2008-0001742 U | 6/2008 |
| KR | 10-2016-0075689 A | 6/2016 |
| WO | 2016/069766 A1 | 5/2016 |

\* cited by examiner

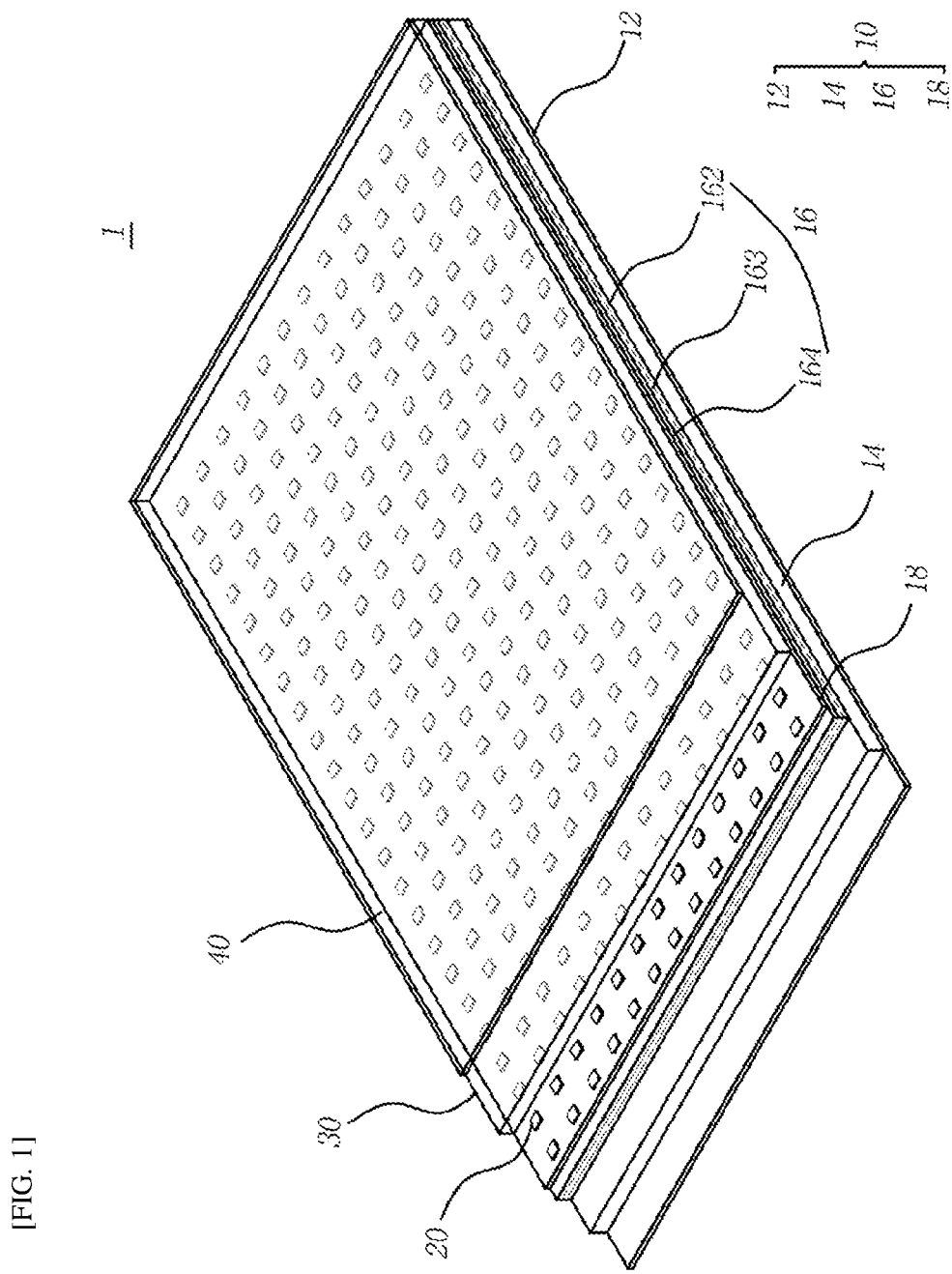
[FIG. 1]

[FIG. 2]
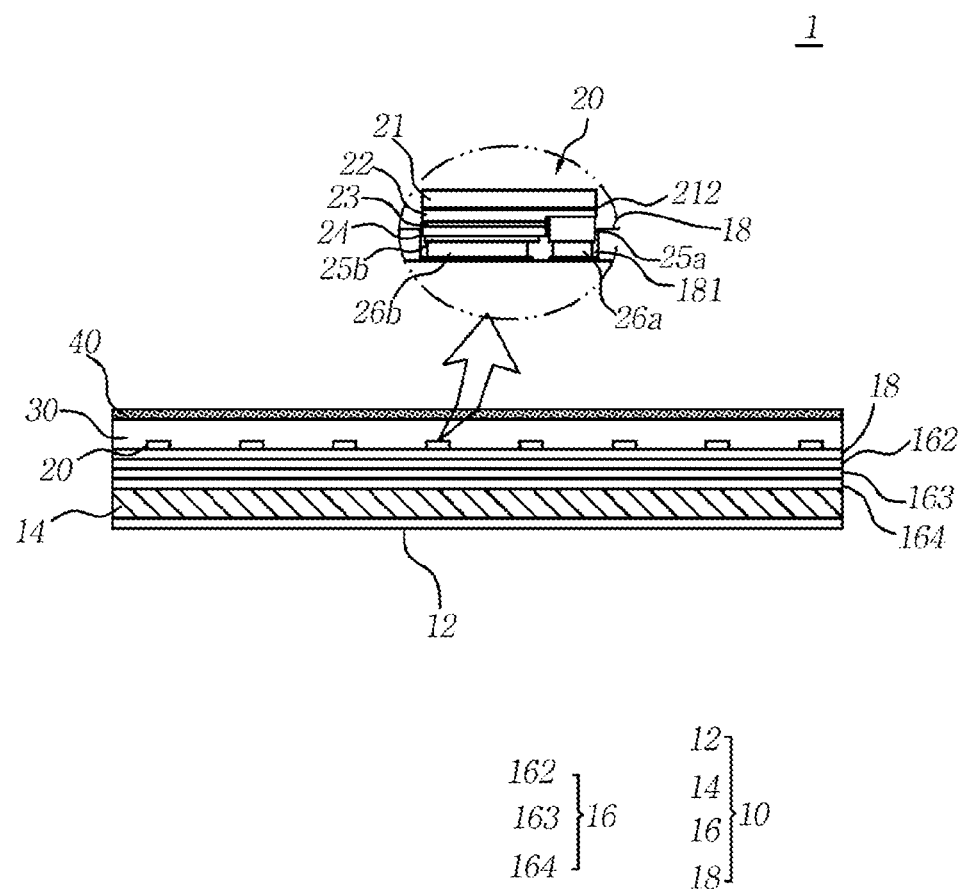

[FIG. 3]
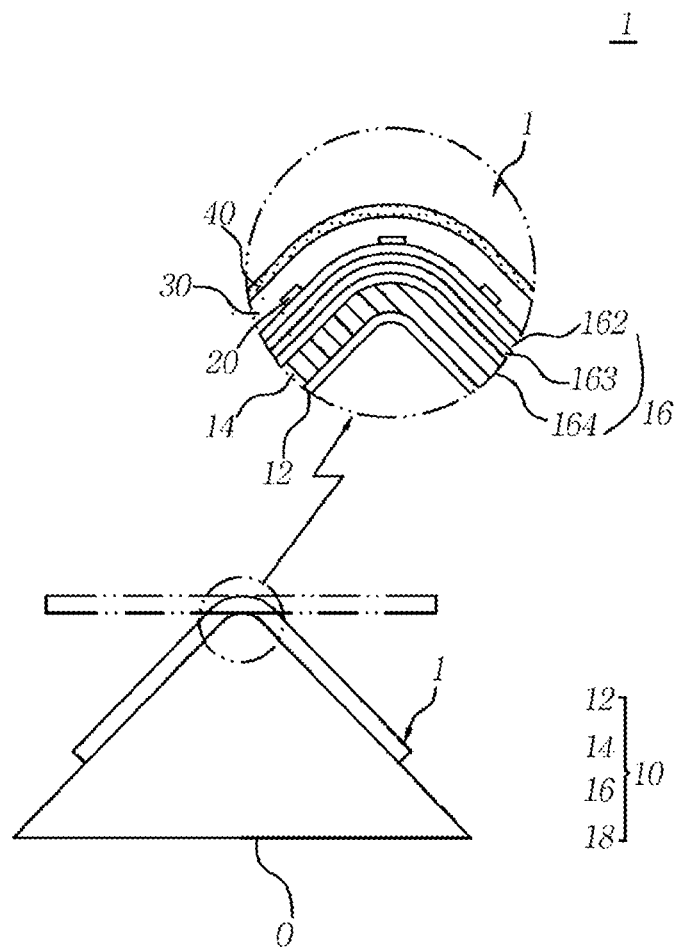
[FIG. 4]
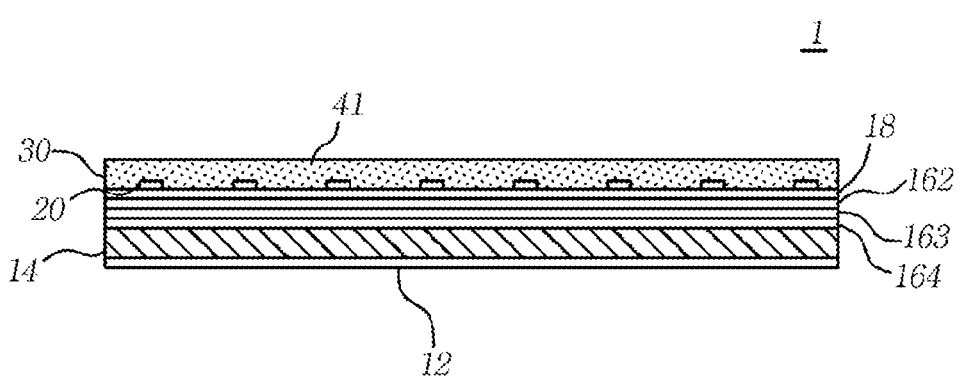

[FIG. 5]
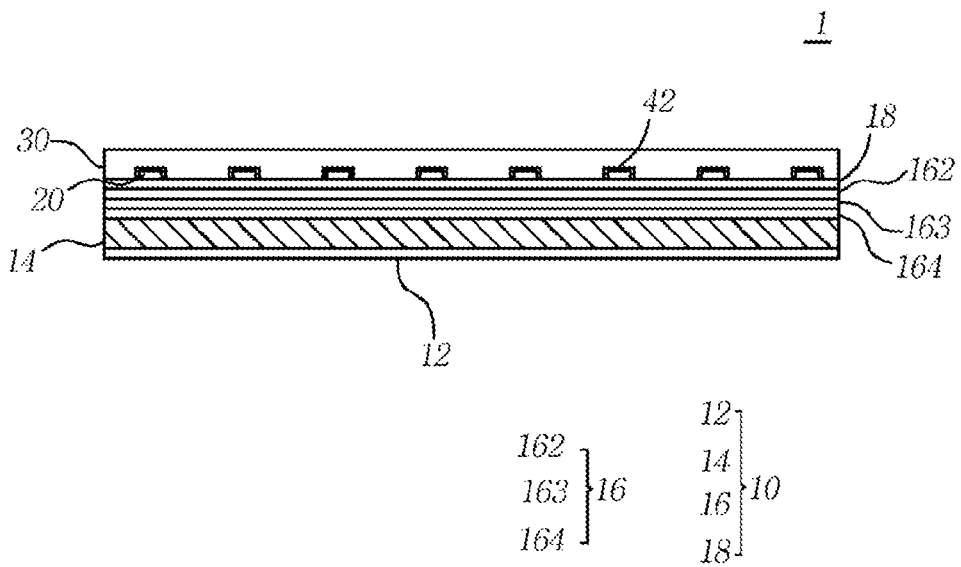
[FIG. 6]
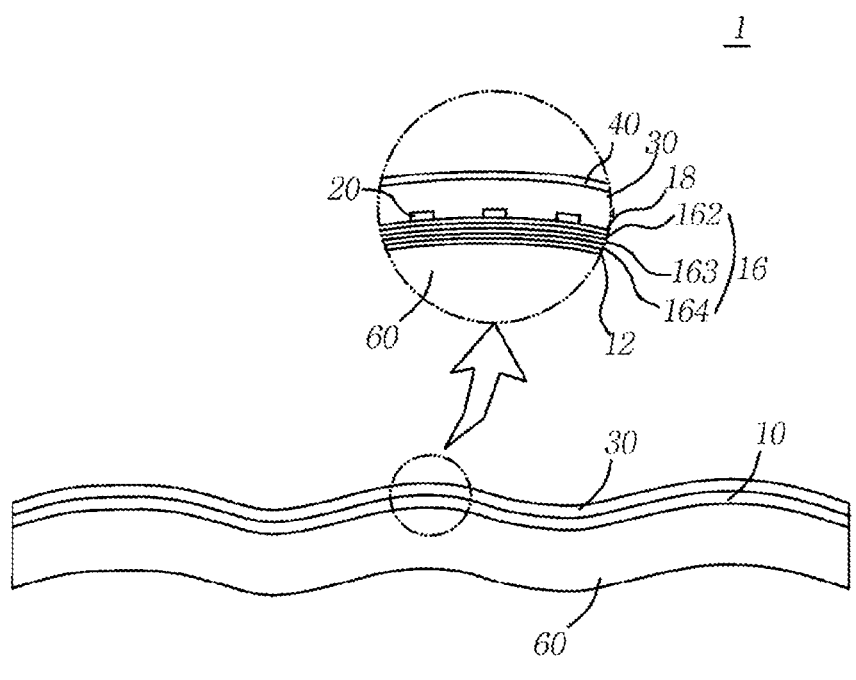

[FIG. 7]
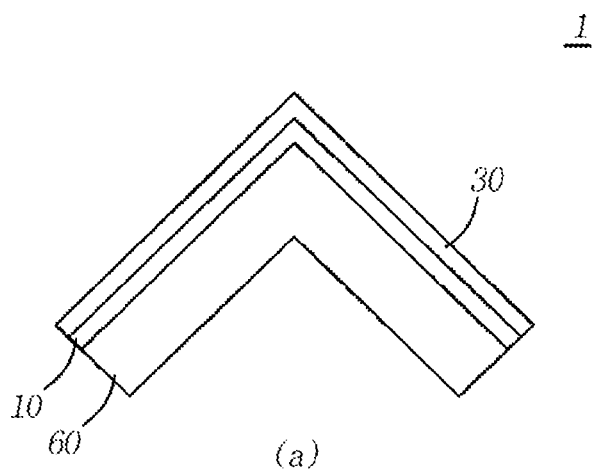
(a)
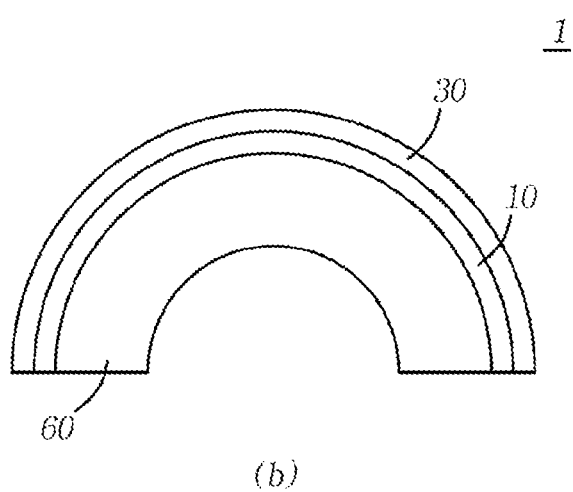
(b)

[FIG. 8]
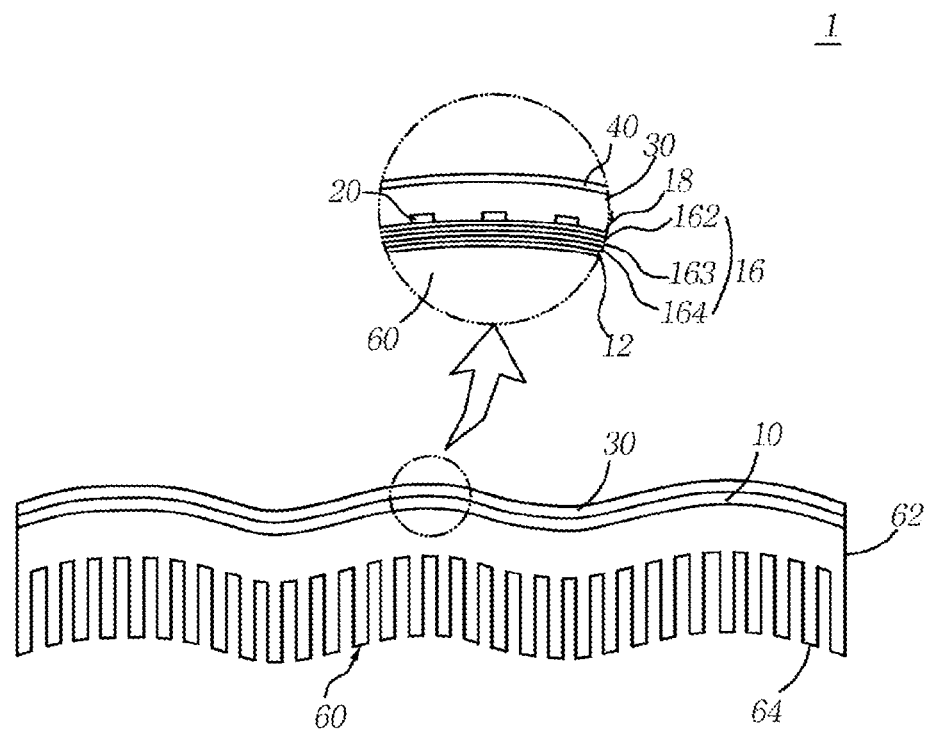
[FIG. 9]
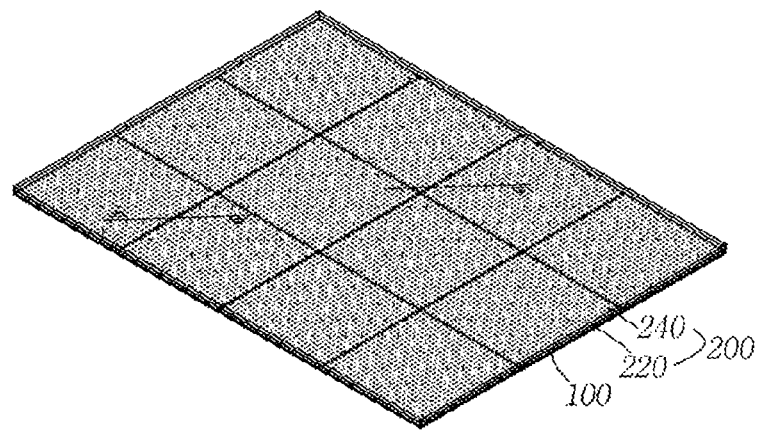

[FIG. 10]
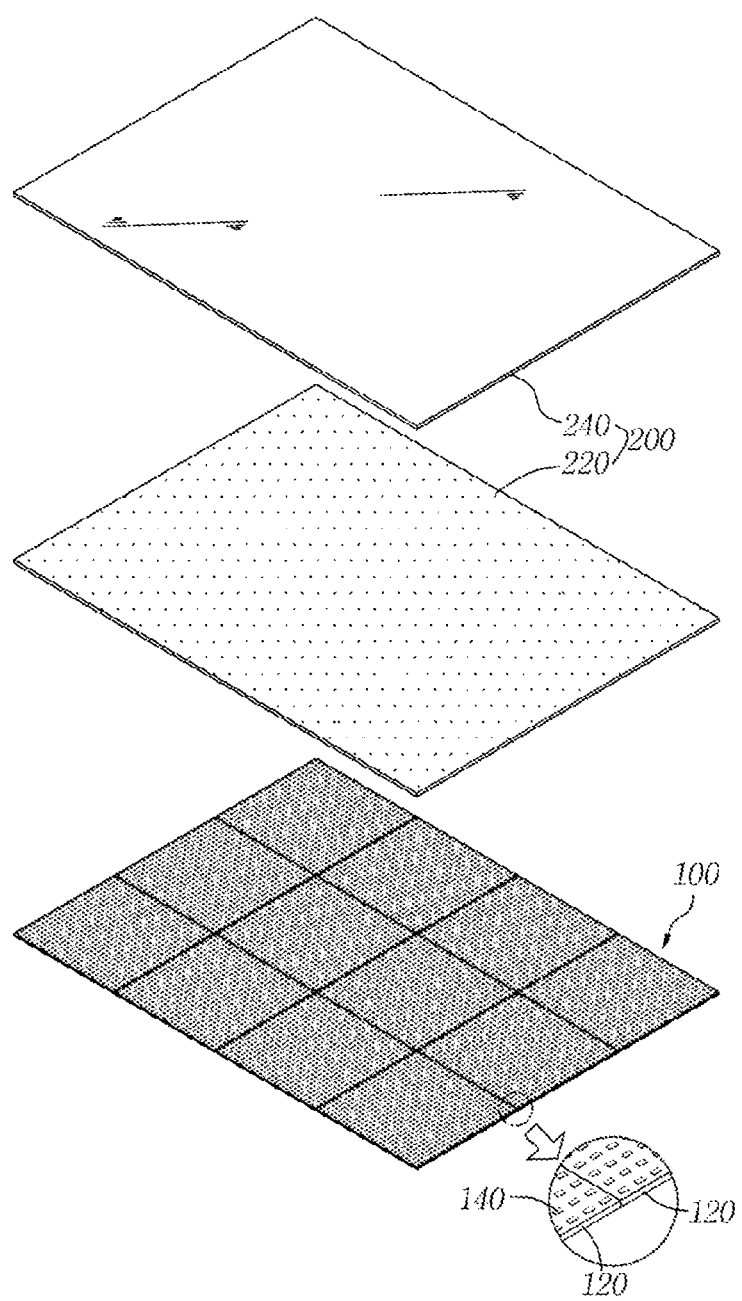

[FIG. 11]
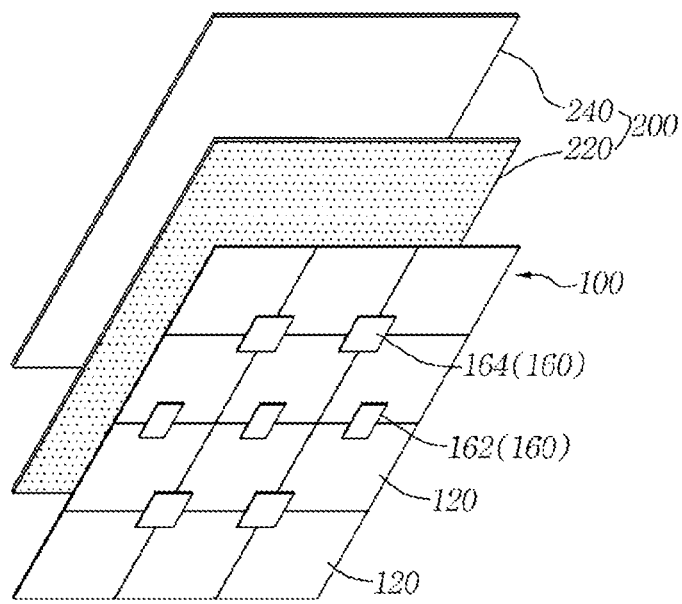
[FIG. 12]
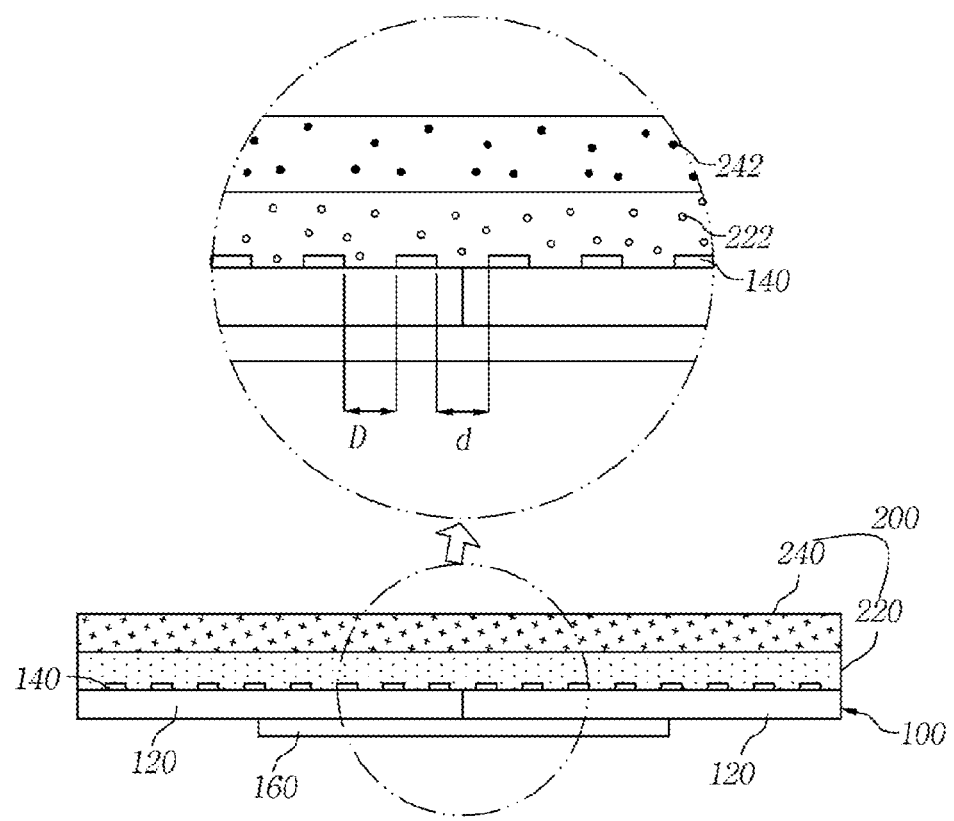

[FIG. 13]
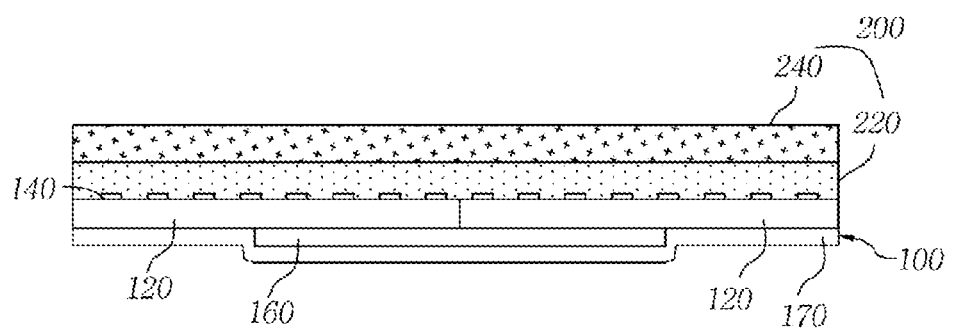
[FIG. 14]
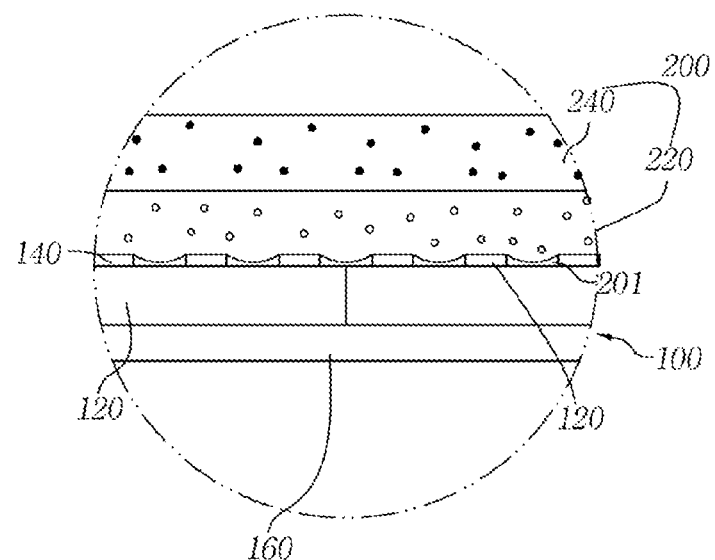

[FIG. 15]
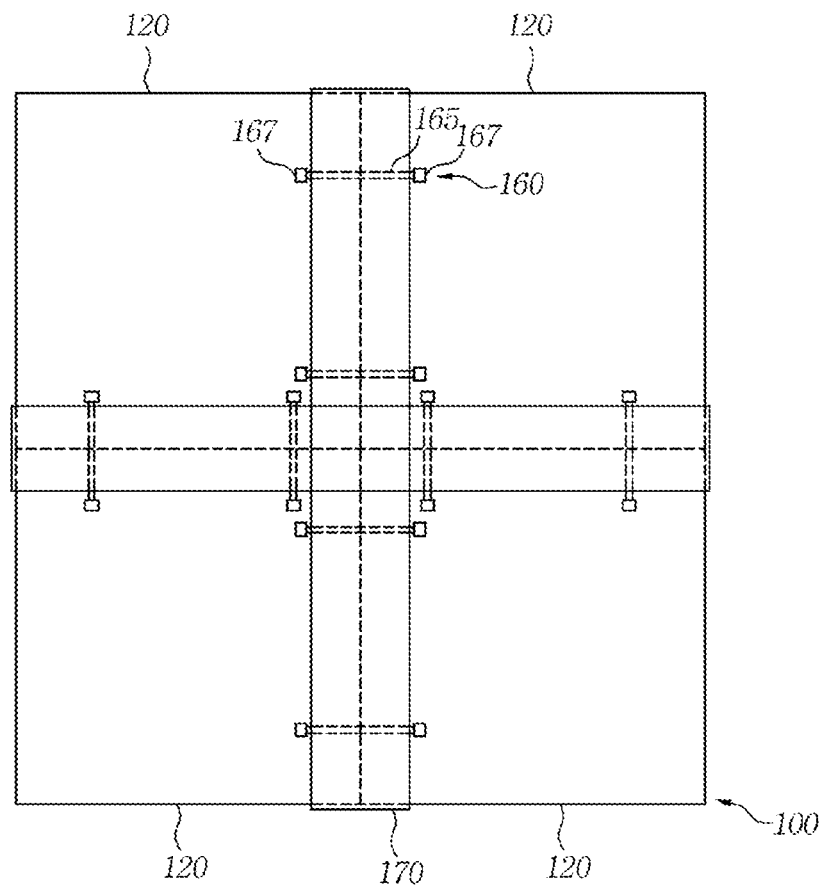
[FIG. 16]
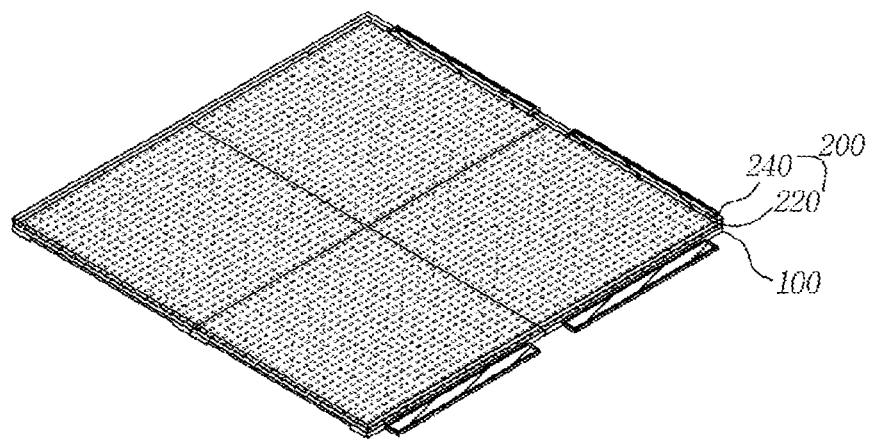

[FIG. 17]
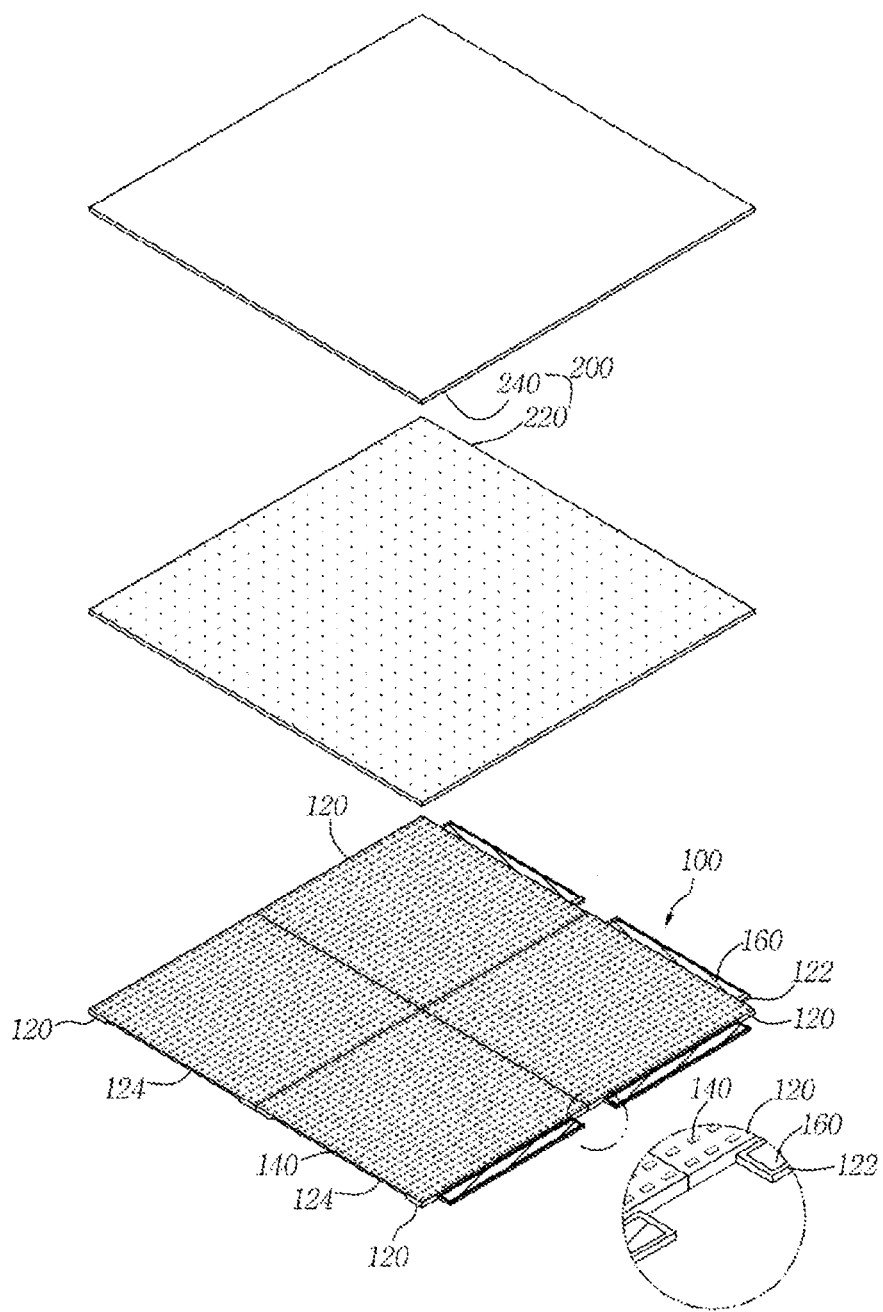

[FIG. 18]
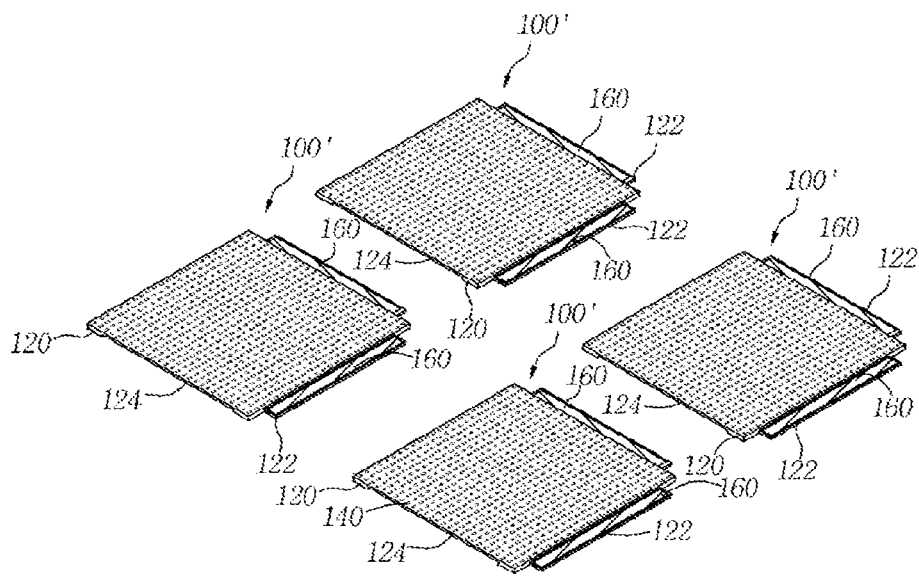
[FIG. 19]
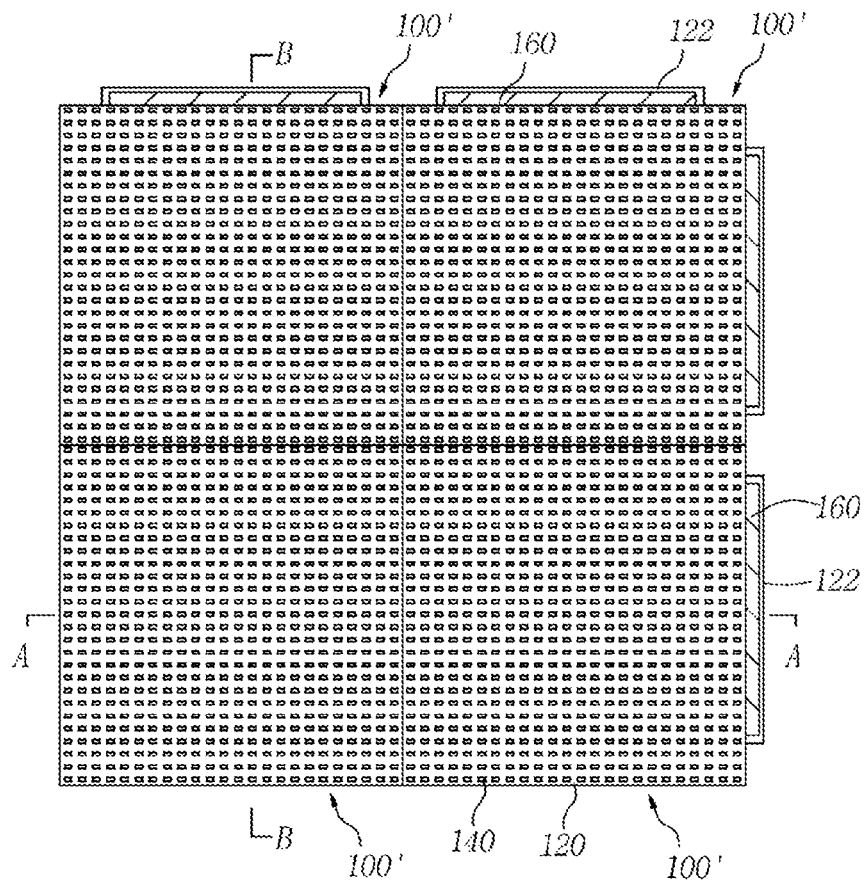

[FIG. 20]
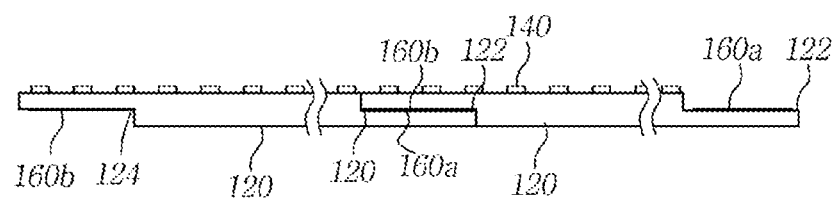
(a)
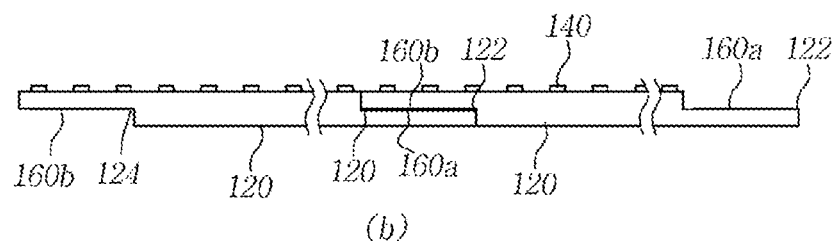
(b)

[FIG. 21]
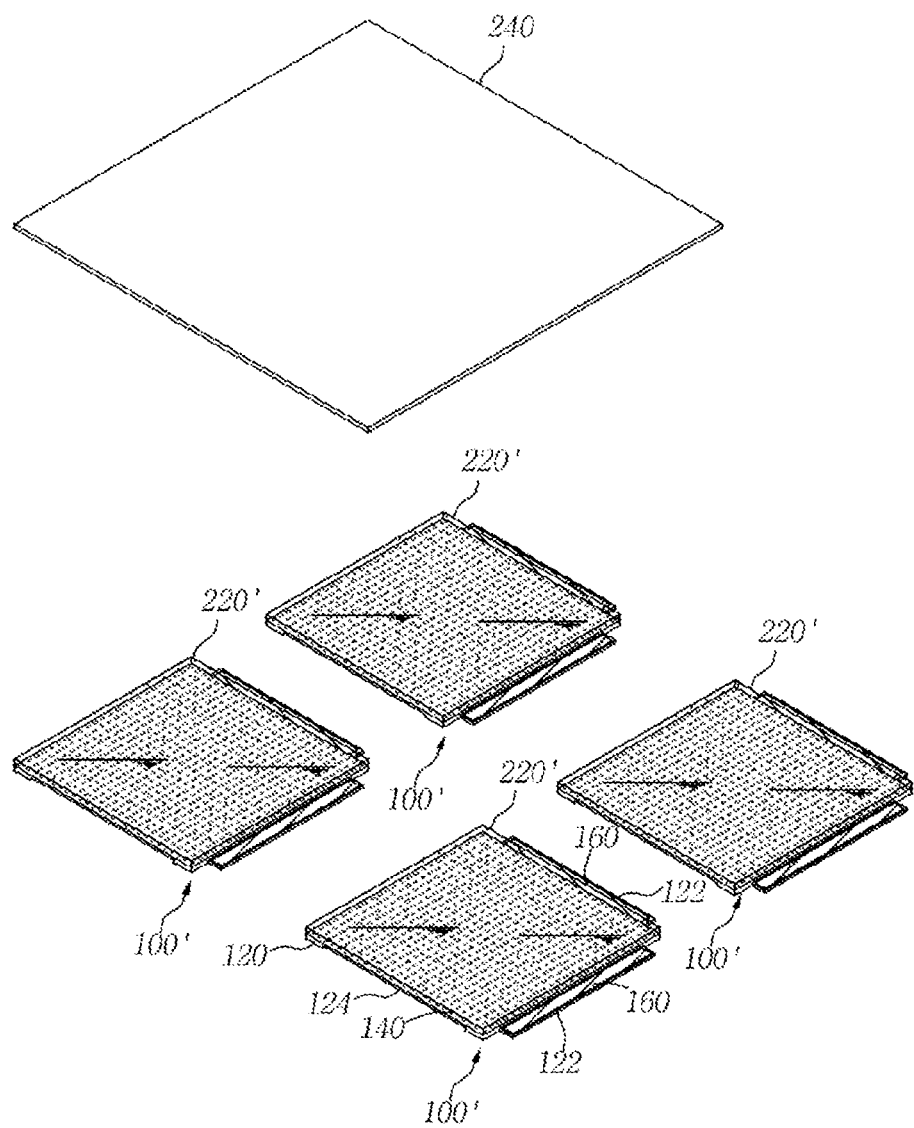

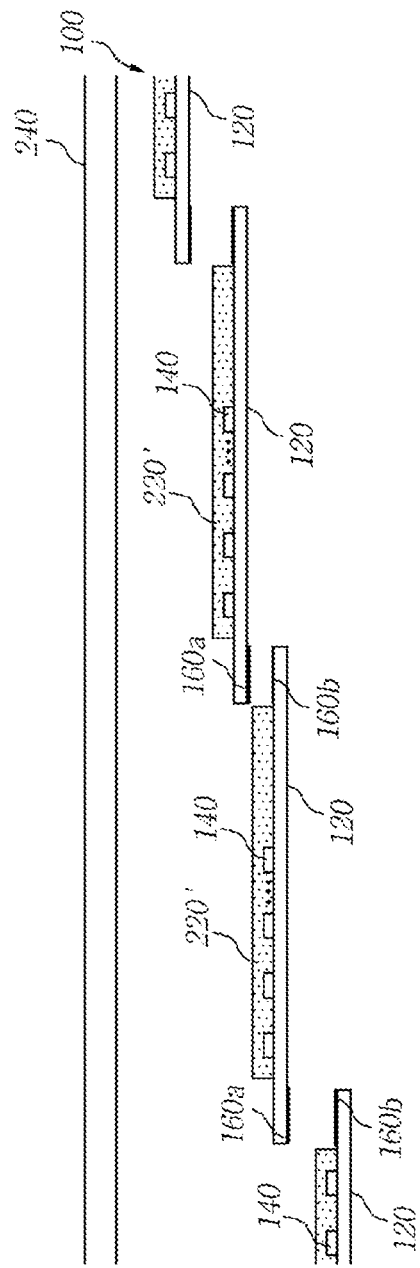
[FIG. 22]

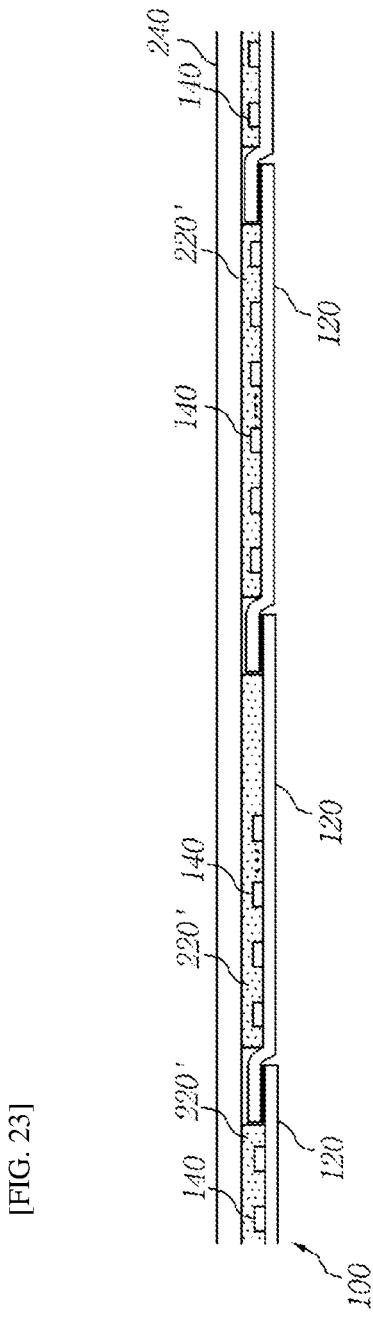
[FIG. 23]

[FIG. 24]
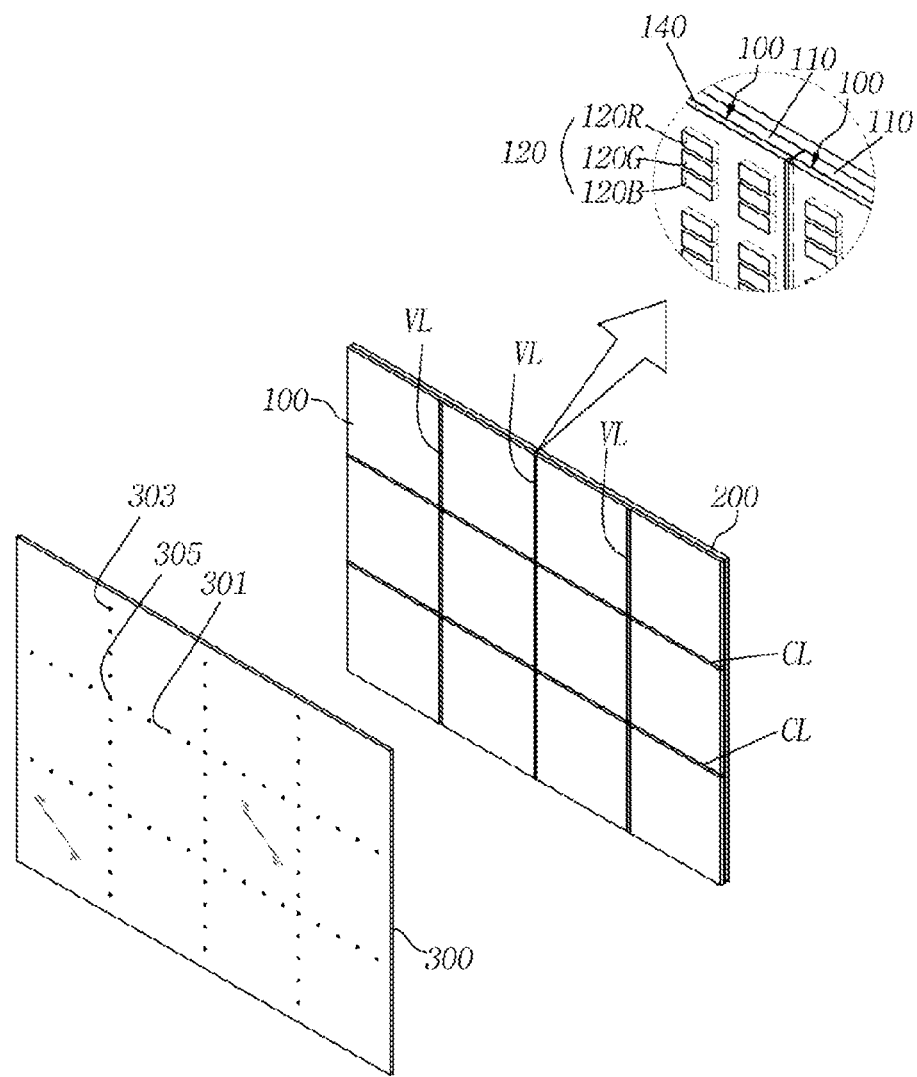

[FIG. 25]
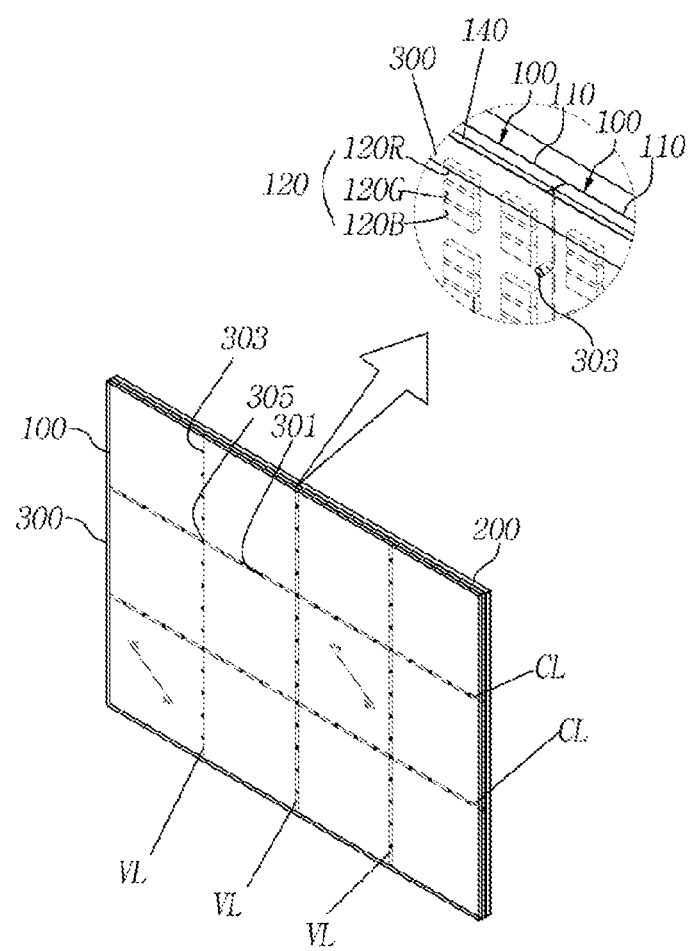

[FIG. 26]
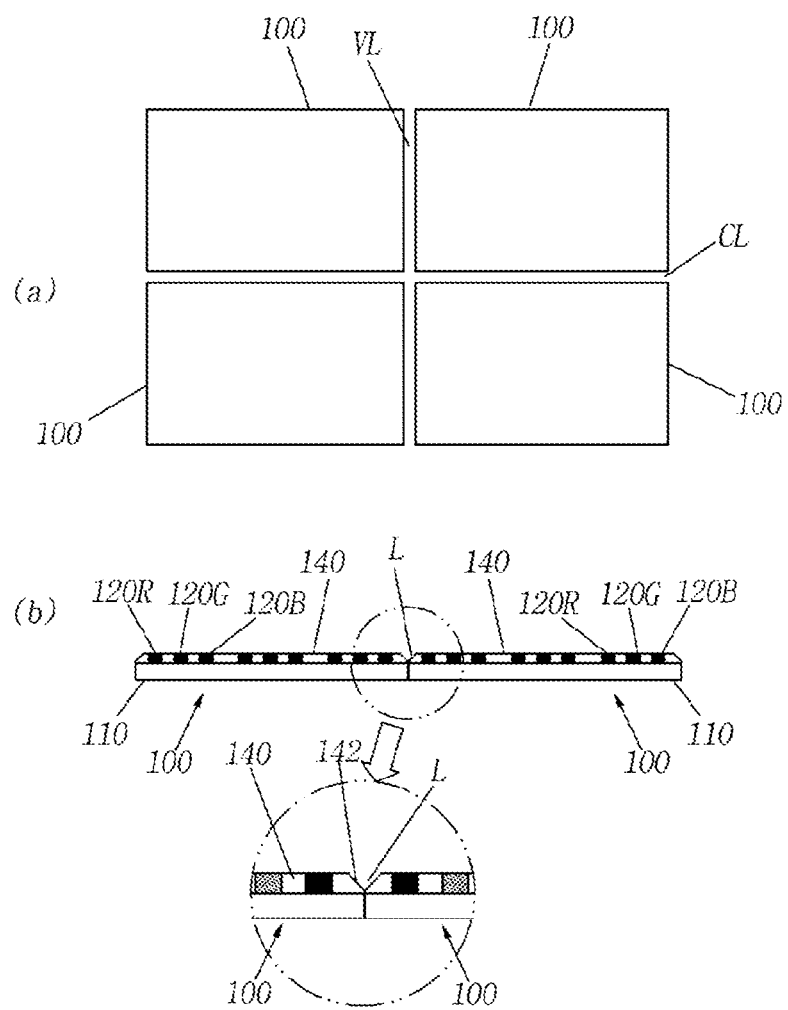

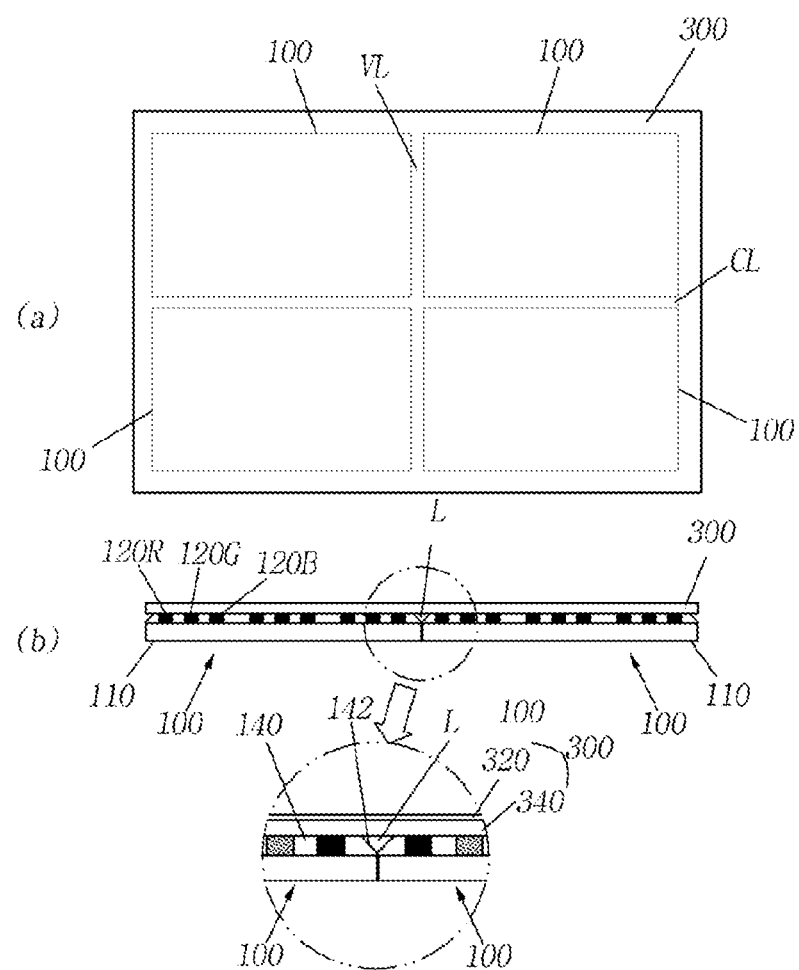
[FIG. 27]

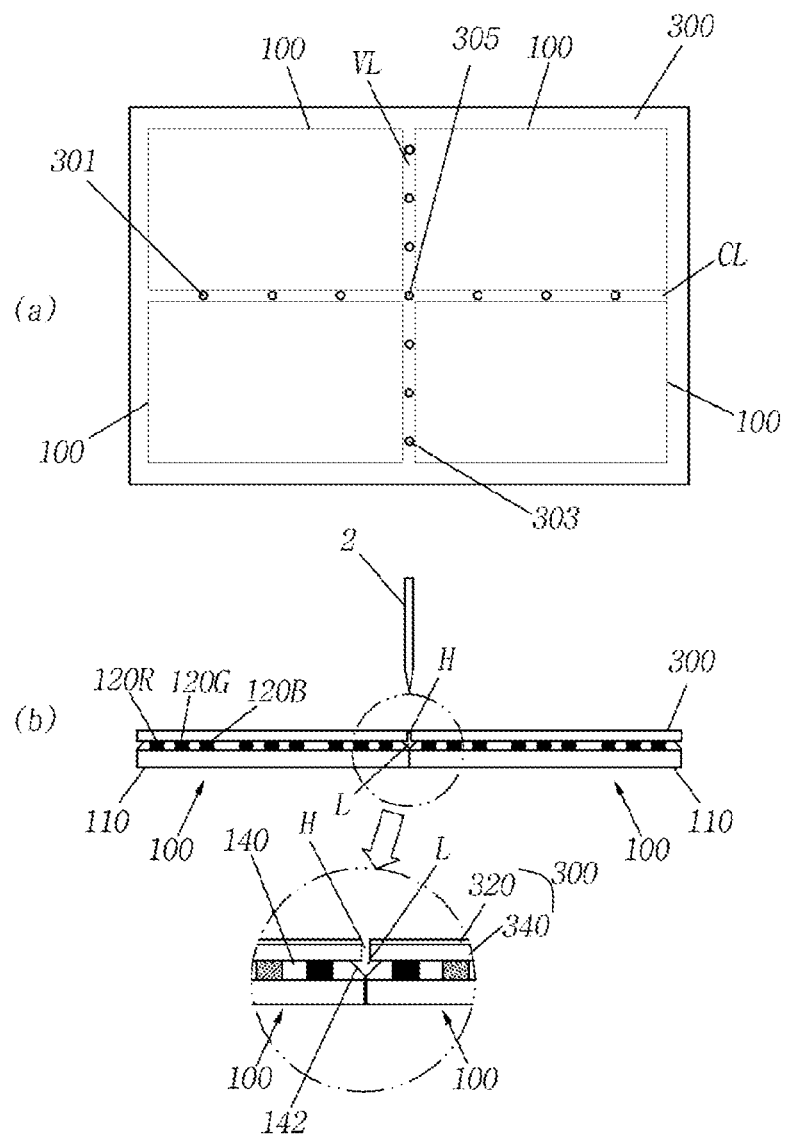
[FIG. 28]

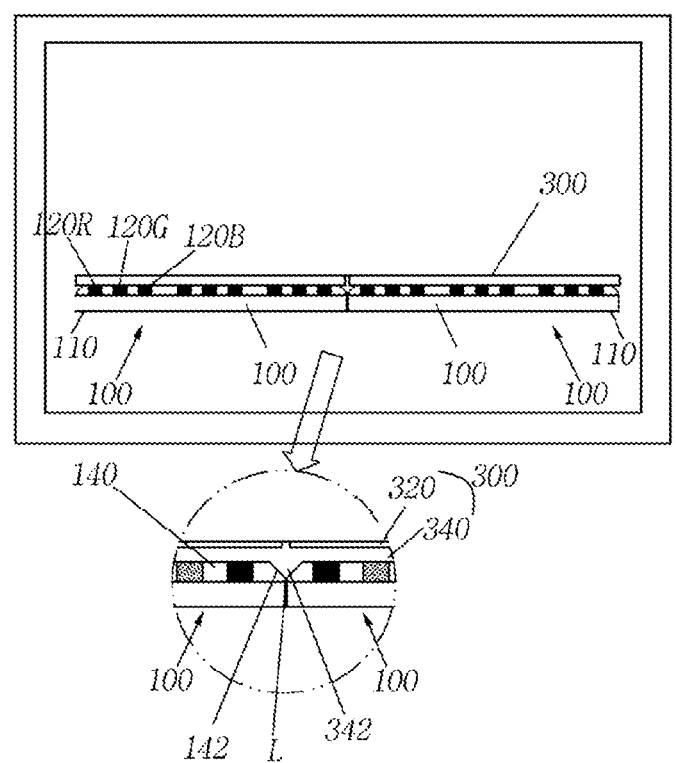
[FIG. 29]

FLEXIBLE LIGHTING DEVICE AND DISPLAY PANEL USING MICRO LED CHIPS

TECHNICAL FIELD

The present invention relates to a flexible lighting device and a display panel using micro-LED chips.

BACKGROUND ART

This section provides background information related to the present invention which is not necessarily prior art.

Surface lighting devices use a plurality of LED packages as light sources are known. Such surface lighting devices are classified into direct-type and edge-type surface lighting devices depending on the arrangement of LED packages. Direct-type surface lighting devices include a plurality of LED packages arranged two-dimensionally over a large area directly under a light-diffusing plate, whereas edge-type surface lighting devices include LED packages arranged along the edges of a rigid light guide plate. However, the rigidity of printed circuit boards mounted with LED packages limit conventional surface lighting devices to planar shapes. Thus, conventional surface lighting devices are not adapted to the surface shapes of various objects and are always installed only on the surface of planar objects. In order to overcome this limitation, an attempt has been made to fabricate flexible surface lighting devices using OLEDs as light sources instead of LED packages. However, the problems of OLEDs, such as high price and low luminous efficiency, make it difficult to commercialize flexible surface lighting devices using OLEDs.

There have been attempts to develop flexible area LED lighting devices including small LED chips, particularly micro-LED chips, each of which has at least one side whose length is less than several hundred micrometers, mounted on a flexible circuit board. However, several technical limitations (for example, limited areas of circuit boards where general die bonders can be used and limited sizes where single flexible circuit boards are applicable) make it difficult to fabricate large-area flexible LED lighting devices.

A micro-LED display panel includes a plurality of planar micro-LED modules, each of which includes a mount substrate and a plurality of micro-LEDs mounted on the mount substrate. The micro-LEDs include red micro-LEDs, green micro-LEDs, and blue micro-LEDs that can form pixels. Each of the micro-LEDs consists of very small micro-LED chips, each of which has at least one side whose length is several to hundreds of micrometers.

A conventional micro-LED display panel can be manufactured by attaching the side surfaces of adjacent planar micro-LED modules such that the micro-LED modules are arrayed in a matrix. In the micro-LED display panel, vertical gap lines are formed between the horizontally adjacent micro-LED modules and horizontal gap lines are formed between the vertically adjacent micro-LED modules. The areas where the gap lines are formed are recessed compared to the other areas.

A flexible light-transmitting film having a specific function, particularly a function of preventing diffuse reflection, is attached on the micro-LED modules arrayed in a matrix. However, air may remain in the gap lines, causing defects in the micro-LED display panel. The gap lines, where air may remain, are recessed particularly because a resin layer in the form of an underfill is inclined in each of the seams between the neighboring micro-LED modules, that is, at the boundary between the neighboring micro-LED modules. Cutting of the light-transmitting film with a laser or blade along the seams (i.e. the gap lines) between the micro-LED modules can be considered to remove the residual air. In this case, the light-transmitting film is cut into smaller pieces whose number corresponds to the number of the LED modules. The light-transmitting film pieces remain attached to the corresponding micro-LED modules. Lines are formed between the light-transmitting film pieces and there is a great difference in refractive index between the lines and the light-transmitting film pieces, resulting in light leakage.

DETAILED DESCRIPTION OF THE INVENTION

Problems to be Solved by the Invention

One object of the present invention is to provide a flexible surface lighting device in which micro-LED chips in the form of unpackaged bare chips are mounted on a flexible substrate in such an arrangement to ensure the flexibility of the flexible substrate, allowing for its deformation into various shapes.

A further object of the present invention is to provide a flexible LED lighting device fabricated over a large area using small-sized flexible circuit boards mounted with LED chips.

Another object of the present invention is to provide a micro-LED display panel in which a light-transmitting film is arranged on the top surfaces of micro-LED modules whose side surfaces are attached to each other to form horizontal and vertical gap lines, such that air remaining between the light-transmitting film and the LED modules due to the horizontal and vertical gap lines is more effectively removed while minimizing the total area of holes through which the air is evacuated.

Means for Solving the Problems

A flexible surface lighting device according to a first disclosure includes: a flexible substrate including an upper insulating film, a lower insulating film, and a thin metal layer interposed between the upper and lower insulating films; a plurality of micro-LED chips two-dimensionally arrayed on the top surface of the flexible substrate; and a flexible light-transmitting resin part disposed on the top surface of the flexible substrate to cover the top and side surfaces of the micro-LED chips, wherein the flexible substrate includes a white reflective layer in contact with the light-transmitting resin part on the upper insulating film.

A flexible LED lighting device according to one aspect of a second disclosure includes: a flexible micro-LED panel including a first micro-LED module including a first flexible circuit board and a plurality of micro-LED chips mounted on the first flexible circuit board and a second micro-LED module including a second flexible circuit board and a plurality of micro-LED chips mounted on the second flexible circuit board; and a light-transmitting sheet disposed on the flexible micro-LED panel to cover the first micro-LED module and the second micro-LED module, wherein the side surfaces of the first and second flexible circuit boards are arranged adjacent to each other in a horizontal or vertical direction and a 2-way interconnection is disposed to electrically connect the bottom surfaces of the first and second flexible circuit boards.

A flexible LED lighting device according to a further aspect of the second disclosure includes: an extended flexible micro-LED panel including at least four flexible circuit boards and a plurality of micro-LED chips mounted on each of the plurality of flexible circuit boards; and a light-transmitting sheet disposed on the extended flexible micro-LED panel to cover the plurality of micro-LED chips, wherein a 4-way interconnection is provided at a point where the bottom surfaces of the plurality of flexible circuit boards meet together to electrically connect the plurality of flexible circuit boards.

A flexible LED lighting device according to another aspect of the second disclosure includes a flexible micro-LED panel and a light-transmitting sheet arranged on the flexible micro-LED panel wherein the flexible micro-LED panel includes: a plurality of flexible circuit boards whose side surfaces are arrayed in contact with each other without gaps along horizontal and vertical directions; a plurality of LED chips mounted on the flexible circuit boards and entirely covered with the light-transmitting sheet; 2-way interconnections, each of which electrically connects the two flexible circuit boards adjacent to each other in a horizontal or vertical direction; and 4-way interconnections, each of which is provided at a point where the four flexible circuit boards meet together to electrically connect the flexible circuit boards, and wherein the 2-way interconnections and the 4-way interconnections lie in the same plane on the bottom surfaces of the flexible circuit boards.

A flexible LED lighting device according to one aspect of a third disclosure includes: a plurality of flexible circuit boards including a first flexible circuit board, a second flexible circuit board, ..., and an N-th flexible circuit board (where N is a natural number of 3 or more), each of which is quadrangular in shape and has one or more sides whose edges overlap; and a plurality of LED chips mounted on the plurality of flexible circuit boards, wherein each of the plurality of flexible circuit boards includes a first edge and a second edge positioned parallel to each other, the first edge has a first stepped portion recessed to a predetermined depth from the top surface of the flexible circuit board, the second edge has a second stepped portion recessed to a predetermined depth from the bottom surface of the flexible circuit board, and a first interconnection is disposed in an area where the first stepped portion of the first flexible circuit board overlaps the second stepped portion of the second flexible circuit board.

A flexible LED lighting device according to a further aspect of the third disclosure includes: a plurality of flexible circuit boards including a first flexible circuit board, a second flexible circuit board, ..., and an N-th flexible circuit board (where N is a natural number of 3 or more), each of which is quadrangular in shape and has one or more sides whose edges overlap; and a plurality of LED chips mounted on the plurality of flexible circuit boards, wherein each of the plurality of flexible circuit boards includes a first edge and a second edge positioned parallel to each other, a first interconnection is disposed in an area where the top surface of the first edge of the first flexible circuit board overlaps the bottom surface of the first flexible circuit board, and the first flexible circuit board is electrically connected to the second flexible circuit board through the first interconnection.

A micro-LED display panel according to one aspect of a fourth disclosure includes: a first micro-LED module including a first mount substrate, a plurality of micro-LED pixels arrayed in a matrix on the top surface of the first mount substrate, and a resin layer formed on the first mount substrate and having inclined faces at edges thereof; a second micro-LED module including a second mount substrate, a plurality of micro-LED pixels arrayed in a matrix on the top surface of the second mount substrate, and a resin layer formed on the second mount substrate and having inclined faces at edges thereof and arranged adjacent to at least one side surface of the first micro-LED module to form a horizontal or vertical gap at the boundary with the first micro-LED module; and a light-transmitting film covering the top surfaces of the first micro-LED module and the second micro-LED module, wherein the light-transmitting film includes first air holes formed along the horizontal gap and second air holes formed along the vertical gap and wherein a sink portion is formed corresponding to each of the first and second air holes and in contact with the inclined faces of the resin layers between the first micro-LED module and the second micro-LED module.

A method for manufacturing a micro-LED display panel according to a further aspect of the fourth disclosure includes: preparing a plurality of micro-LED modules, each of which including a mount substrate and a plurality of micro-LED chips arrayed in a matrix on the mount substrate; attaching the side surfaces of the adjacent micro-LED modules such that horizontal gap lines and vertical gap lines are formed; and arranging a light-transmitting film such that it is in contact with the top surfaces of the plurality of micro-LED modules, wherein the light-transmitting film includes first air holes formed along the horizontal gap lines and second air holes formed along the vertical gap lines.

Effects of the Invention

The flexible surface lighting device of the first disclosure can be deformed into various shapes because micro-LED chips in the form of unpackaged bare chips are mounted on a flexible substrate in such an arrangement to ensure the flexibility of the flexible substrate. In addition, the flexible surface lighting device can be deformed into and maintained in a desired shape because a shape retention layer formed in the flexible substrate and a heat-dissipating part coupled with the flexible substrate is deformed to maintain the flexible substrate.

The flexible LED lighting devices of the second disclosure and the third disclosure are very small in thickness and can be freely curved with different curvatures. The flexible LED lighting devices can emit uniform surface light when curved with predetermined curvatures. Each of the flexible LED lighting devices of the second disclosure can be fabricated over a large area by preparing a plurality of flexible LED modules including a small-sized flexible circuit board and LED chips mounted on the flexible circuit board, arranging the plurality of LED modules such that the side surfaces of the LED modules are adjacent to each other without gaps, and electrically connecting the LED chips of the LED modules in series, parallel or series-parallel. In addition, each of the flexible LED lighting device of the second disclosure can be fabricated in an efficient and economically feasible manner because a large-area wavelength-converting sheet and a large-area light-diffusing sheet cover a plurality of LED chips provided in a plurality of flexible LED modules, that is, all LED chips mounted on a plurality of flexible circuit boards whose side surfaces are connected to each other without gaps. The boundaries between the LED modules are not well-defined because the side surfaces of the LED modules are attached to each other without gaps. Furthermore, the flexible LED lighting devices of the second disclosure can be advantageously used for various lighting applications, including design lighting, interior lighting, vehicle indoor lighting, and building indoor lighting.

The micro-LED display panel of the fourth disclosure includes a light-transmitting film arranged on the top surfaces of micro-LED modules whose side surfaces are attached to each other to form horizontal and vertical gap lines. The formation of the horizontal and vertical gap lines enables more effective removal of air remaining between the light-transmitting film and the LED modules while minimizing the total area of holes through which the air is evacuated.

BRIEF DESCRIPTION OF THE DRAWINGS

FIG. 1 is a partially cut-away perspective view illustrating a flexible surface lighting device according to a first embodiment of a first disclosure.

FIG. 2 is a cross-sectional view illustrating the flexible surface lighting device according to the first embodiment of the first disclosure.

FIG. 3 illustrates an application example of the flexible surface lighting device of FIGS. 1 and 2.

FIG. 4 is a cross-sectional view illustrating a flexible surface lighting device according to a second embodiment of the first disclosure.

FIG. 5 is a cross-sectional view illustrating a flexible surface lighting device according to a third embodiment of the first disclosure.

FIG. 6 is a cross-sectional view illustrating a flexible surface lighting device according to a fourth embodiment of the first disclosure.

FIG. 7 illustrates application examples of the flexible surface lighting device according to the fourth embodiment of the first disclosure.

FIG. 8 is a cross-sectional view illustrating a flexible surface lighting device according to a fifth embodiment of the first disclosure.

FIG. 9 is a perspective view illustrating a flexible LED lighting device according to one embodiment of a second disclosure.

FIG. 10 is an exploded perspective view illustrating a flexible LED lighting device according to one embodiment of the second disclosure.

FIG. 11 is an exploded bottom perspective view illustrating a flexible LED lighting device according to one embodiment of the second disclosure.

FIG. 12 is an enlarged cross-sectional view illustrating a flexible LED lighting device according to one embodiment of the second disclosure.

FIG. 13 is an enlarged cross-sectional view illustrating a flexible LED lighting device further including a flexible boundary adhesive part according to a further embodiment of the second disclosure.

FIG. 14 is an enlarged cross-sectional view illustrating an LED lighting device further including an underfill material according to a further embodiment of the second disclosure.

FIG. 15 is a bottom view illustrating a flexible LED lighting device according to another embodiment of the second disclosure.

FIG. 16 is a perspective view illustrating a flexible LED lighting device according to one embodiment of a third disclosure.

FIG. 17 is an exploded perspective view illustrating a flexible LED lighting device according to one embodiment of the third disclosure.

FIG. 18 is an exploded perspective view illustrating an extended flexible micro-LED panel of a flexible LED lighting device according to one embodiment of the third disclosure.

FIG. 19 is a plan view illustrating the extended flexible micro-LED panel of FIG. 18.

FIG. 20 illustrates (a) a cross-sectional view taken along line A-A of FIG. 19 and (b) a cross-sectional view taken along line B-B of FIG. 19.

FIG. 21 is an exploded perspective view illustrating a flexible LED lighting device according to a further embodiment of the third disclosure.

FIG. 22 is an exploded cross-sectional view illustrating a flexible LED lighting device according to another embodiment of the third disclosure.

FIG. 23 is a cross-sectional view of the flexible LED lighting device of FIG. 22.

FIG. 24 is a perspective view illustrating a state in which a light-transmitting film is separated from a micro-LED display panel according to one embodiment of a fourth disclosure.

FIG. 25 is a perspective view illustrating a state in which a light-transmitting film is attached to a micro-LED display panel according to one embodiment of the fourth disclosure.

FIGS. 26 to 29 sequentially illustrate a method for manufacturing a micro-LED display panel according to one embodiment of the fourth disclosure.

MODE FOR CARRYING OUT THE INVENTION

[First Disclosure]

A first disclosure will be described with reference only to FIGS. 1 to 8.

FIGS. 1 to 3 illustrate a flexible surface lighting device according to a first embodiment of a first disclosure.

Referring to FIGS. 1 to 3, the flexible surface lighting device 1 includes a flexible substrate 10, micro-LED chips 20, a light-transmitting resin part 30, and a wavelength-converting film 40. The flexible surface lighting device 1 can be deformed into a desired shape when an external force is applied thereto and can maintain its deformed shape when the external force is removed.

In this embodiment, the flexible substrate 10 includes a flexible substrate material and a circuit. For example, the flexible substrate 10 may be a flexible printed circuit board (FPCB). The flexible substrate 10 is flexible enough to allow its deformation and has a function of retaining its shape after deformation, which will be described in more detail.

The plurality of micro-LED chips 20 are two-dimensionally arrayed in a matrix on the top surface of the flexible substrate 10. Each of the micro-LED chips 20 has at least one side whose length is several to hundreds of micrometers, more preferably, two hundred micrometers or less. The flexible substrate 10 can be deformed into a desired shape when the small-sized chips are arrayed at sufficient pitches on the flexible substrate 10.

In this embodiment, each of the micro-LED chips 20 includes a transparent sapphire substrate 21, a buffer layer 212 formed in contact with the lower surface of the transparent sapphire substrate 21, and a first conductive semiconductor layer 22, an active layer 23, and a second conductive semiconductor layer 24 formed in this order from the bottom of the buffer layer 212. Each of the micro-LED chips 20 is of a flip-chip type in which a first electrode pad 25a connected to the first conductive semiconductor layer 22 and a second electrode pad 25b connected to the second conductive semiconductor layer 24 are disposed to face the flexible substrate 10. The first electrode pad 25a and the second electrode pad 25b are connected to a first electrode and a second electrode disposed on the flexible substrate through a first solder bump 26*a* and a second solder bump 26*b*, respectively.

The first electrode pad 25*a* can be connected to the first conductive semiconductor layer 25*a* through an open region formed by partially removing the active layer 23 and the second conductive semiconductor layer 24 from the semiconductor stack structure of the micro-LED chip 20. Each of the LED chips may be of a lateral type in which electrode pads are connected to electrodes disposed on a substrate through bonding wires. In this case, the bonding wires are likely to fall off or be damaged when the flexible substrate 10 is deformed. The use of the flip-chip type LED chips in this embodiment avoids this problem even when the flexible substrate 10 is deformed.

The micro-LED chips 20 may be blue LED chips emitting light at a wavelength, particularly blue light, that can be combined with wavelength-converting materials to produce white light. The micro-LED chips 20 are more preferably gallium nitride LED chips.

The light-transmitting resin part 30 has high transmittance for light from the micro-LED chips 20 and completely covers the top and side surfaces of the micro-LED chips 20 and the top surface of the flexible substrate 10. The light-transmitting resin part 30 is formed in contact with the top and side surfaces of the micro-LED chips 20 and the top surface of the flexible substrate 10. It is preferable that the top surface of the light-transmitting resin part 30 is parallel to the top surface of the flexible substrate 10. The light-transmitting resin part 30 is preferably made of a transparent silicone or epoxy resin. The light-transmitting resin part 30 is flexible enough to be deformable when the flexible substrate 10 is deformed. Although not illustrated, a light diffusion or scattering pattern may be formed on the top surface of the light-transmitting resin part 30.

The wavelength-converting film 40 is formed on the top surface of the light-transmitting resin part 30 and includes wavelength-converting materials to convert the wavelength of light emitted from the side and top surfaces of the micro-LED chips 20 and passing through the light-transmitting resin part 30. The wavelength-converting materials may include one or more phosphors or quantum dots.

As mentioned above, the flexible substrate 10 is flexible enough to allow its deformation when an external force is applied thereto and has a function of retaining its shape after deformation. To this end, the flexible substrate 10 includes a shape retention layer 14 that serves to maintain its deformed shape when the external force is removed.

More specifically, the flexible substrate 10 further includes an uppermost white reflective layer 18 arranged in contact with the light-transmitting resin part 30 and a core layer 16 formed under the white reflective layer 18. The shape retention layer 14 underlies the core layer 16. The white reflective layer 18 is preferably a white PSR film with high reflectivity.

The white reflective layer 18 has a plurality of holes 181 formed corresponding to the micro-LED chips 20. The micro-LED chips 20 are located in the corresponding holes 181 (only one is illustrated in FIG. 2). The depth of each of the plurality of holes 181 is determined such that a lower portion of the micro-LED chip 20 or the solder bumps can be accommodated in the hole 181 but the active layer of the micro-LED chip 20 is located outside the hole.

The core layer 16 substantially functions as a circuit board of the flexible substrate 10 and includes an upper insulating film 162, a lower insulating film 164, and a thin metal layer 163 interposed between the two insulating films. In this embodiment, polyimide films are used as the upper insulating film 162 and the lower insulating film 164. The thin metal layer 163 is in the form of a thin metal film having a predetermined pattern. In this embodiment, a Cu thin film is used as the thin metal layer 163.

In this embodiment, the shape retention layer 14 is formed in contact with the lower surface of the core layer 16, particularly the lower surface of the lower insulating film 164, and is composed of a metal material with a predetermined thickness that is sufficiently flexible to allow its deformation and has the ability to retain its shape after deformation. In this embodiment, an Al plate having a predetermined thickness is used as the shape retention layer 14. It should be noted that the term "Al plate" as used herein is intended to include Al alloy plates. The use of an Al plate as the shape retention layer 14 enables deformation (e.g., bending or warpage) of the flexible substrate 10 by an external force while maintaining the deformed shape when the external force is removed.

The flexible surface lighting device 1 indicated by an imaginary line in FIG. 3 is bent to a predetermined angle corresponding to the upper curved portion of an object O having a triangular cross section. The flexible surface lighting device 1 is maintained in its curved shape due to the shape retention layer 14. The flexible substrate 10 may further include a lowermost adhesive film 12 attached to the external object O.

FIG. 4 is a cross-sectional view illustrating a flexible surface lighting device according to a second embodiment of the first disclosure.

Referring to FIG. 4, the flexible surface lighting device 1 includes a flexible substrate 10, micro-LED chips 20, and a light-transmitting resin part 30. The flexible surface lighting device 1 avoids the use of a wavelength-converting film and instead uses wavelength-converting materials 41 widely distributed in the light-transmitting resin part 30, unlike in the previous embodiment. For example, the wavelength-converting materials 41 may be phosphors or quantum dots.

FIG. 5 is a cross-sectional view illustrating a flexible surface lighting device according to a third embodiment of the first disclosure.

Referring to FIG. 5, the flexible surface lighting device 1 includes a flexible substrate 10, micro-LED chips 20, and a light-transmitting resin part 30. The flexible surface lighting device includes a wavelength-converting layer 42 covering the top and side surfaces of the micro-LED chips 20, unlike in the foregoing embodiments. The wavelength-converting layer 42 is composed of wavelength-converting materials such as phosphors or quantum dots.

FIG. 6 illustrates a flexible surface lighting device according to a fourth embodiment of the first disclosure.

Referring to FIG. 6, the flexible surface lighting device includes a flexible substrate 10, a plurality of micro-LED chips 20 arrayed two-dimensionally on the top surface of the flexible substrate 10, wavelength-converting materials converting the wavelength of light emitted from the top and side surfaces of the micro-LED chips 20, a heat-dissipating part 60 having a curved surface to which the flexible substrate 10 is curvedly coupled, and a light-transmitting resin part 30 disposed on the top surface of the flexible substrate 10 to cover the top and side surfaces of the micro-LED chips 20. The light-transmitting resin part 30 is flexible enough to be curvedly deformed together with the flexible substrate 10 coupled to the curved surface of the heat-dissipating part 60.

The flexible substrate 10 further includes an uppermost white reflective layer 18 arranged in contact with the light-transmitting resin part 30 and a core layer 16 formed under the white reflective layer 18. The white reflective layer 18 is preferably a white PSR film with high reflectivity. The core layer 16 substantially functions as a circuit board of the flexible substrate 10 and includes an upper insulating film 162, a lower insulating film 164, and a thin metal layer 163 interposed between the two insulating films. In this embodiment, polyimide films are used as the upper insulating film 162 and the lower insulating film 164. The thin metal layer 163 is in the form of a thin metal film having a predetermined pattern. In this embodiment, a Cu thin film is used as the thin metal layer 163.

The flexible substrate 10 includes an adhesive film 12 formed under the core layer 16. The adhesive film 12 of the flexible substrate 10 is adhered to the heat-dissipating part 60. The heat-dissipating part 60 is made of a metal material that is sufficiently flexible to allow its deformation and has the ability to retain its shape after deformation. In this embodiment, an Al plate having a predetermined thickness is used as the heat-dissipating part 60. The heat-dissipating part 60 and the flexible substrate 10 coupled to the heat-dissipating part 60 may be deformed into various shapes by an external force. Due to the ability of the heat-dissipating part 60 to maintain its deformed shape when the external force is removed, the flexible substrate 10 also maintains its deformed shape. That is, the flexible substrate 60 maintains its own deformed shape depending on the deformed shape of the heat dissipating part 60. As illustrated in FIG. 6, the heat-dissipating part 60 maintains its wavy shape and the flexible substrate 10 coupled thereto also maintains its deformed shape. The light-transmitting resin part 30 coupled with the flexible substrate 10 also maintains its shape corresponding to the wavy shape of the heat-dissipating part 60, like the flexible substrate 10.

The flexible substrate 10 and the light-transmitting resin part 30 are flexible and the heat-dissipating part 60 coupled with the flexible substrate 10 has the ability to maintain its curvedly deformed shape. Accordingly, when the heat-dissipating part 60 is deformed into a curved shape, the flexible substrate 10 and the light-transmitting resin 30 can also maintain their shapes corresponding to the deformed shape of the heat-dissipating part 60. FIG. 7 illustrates exemplary deformed shapes of the heat-dissipating part 60, the flexible substrate 10, and the light-transmitting resin part 30. When the heat-dissipating part 60 is bent to approximately 90°, the flexible substrate 10 and the light-transmitting resin part 30 are also bent to approximately 90° ((a) of FIG. 7). Alternatively, when the heat-dissipating part 60 is curved into a semicircular shape, the flexible substrate 10 and the light-transmitting resin part 30 are also curved into semicircular shapes ((b) of FIG. 7).

FIG. 8 is a cross-sectional view illustrating a flexible surface lighting device according to a fifth embodiment of the first disclosure.

Referring to FIG. 8, the flexible surface lighting device includes a heat-dissipating part 60 consisting of a heat sink 62 and a plurality of heat sink fins 64 formed on the bottom of the heat sink 62. The heat-dissipating part 60 is made of a metal plate, preferably an Al plate, that can be deformed by an external force and maintain its deformed shape when the external force is removed. The other elements and parts are substantially the same as those of the fourth embodiment of the first disclosure and their detailed description is thus omitted.

Although not described in detail in the foregoing embodiments, each of the flexible surface lighting devices according to the first disclosure may further include a light-diffusing film disposed on the top surface of the light-transmitting resin part.

According to the first disclosure, the thickness of the flexible substrate 10 may vary depending on the size and pitch of the micro-LED chips 20 mounted on the flexible substrate 10. For example, when the micro-LED chips 20 have a width of several tens to hundreds of micrometers, more preferably, a size of 100 μm×300 μm, and arrayed at pitches of approximately 0.8 mm, the flexible substrate 10 may have a thickness of approximately 0.15 mm. Alternatively, when the micro-LED chips 20 are arrayed at pitches of approximately 0.6 to 0.8 mm, the flexible substrate 10 may have a thickness of approximately 0.30 mm. Alternatively, when the micro-LED chips 20 are arrayed at pitches of approximately 0.4 to 0.6 mm, the flexible substrate 10 may have a thickness of approximately 0.45 mm Although the reduced pitch of the micro-LED chips ensures uniform surface light, the layer number and thickness of the flexible substrate 10 increase, making it difficult to freely change the curvature of the flexible surface lighting device.

[Second Disclosure]

A second disclosure will be described with reference only to FIGS. 9 to 15.

FIGS. 9 to 12 illustrate a flexible LED lighting device according to one embodiment of a second disclosure.

Referring to FIGS. 9 to 12, the flexible LED lighting device includes an extended flexible micro-LED panel 100 and a light-transmitting sheet 200 disposed on the extended flexible micro-LED panel 100. The flexible LED lighting device is a surface lighting device that can be deformed into various shapes.

The light-transmitting sheet 200 receives light emitted from the extended flexible micro-LED panel 100 through the bottom surface thereof and radiates the received light to the outside through the top surface thereof. The light-transmitting sheet 200 may be in the form of a monolayer film but preferably has a structure in which two or more films with various functions are laminated on each other. In this embodiment, the light-transmitting sheet 200 is stacked in direct contact with the top surface of the extended flexible micro-LED panel 100 and includes a wavelength-converting sheet 220 converting the wavelength of light emitted from the extended flexible micro-LED panel 100 and a light-diffusing sheet 240 diffusing light passing through the wavelength-converting sheet 220 and emitting the diffused light to the outside.

The wavelength-converting sheet 220 is made by mixing wavelength-converting materials 222 such as phosphors or quantum dots with a transparent resin and molding the mixture. Light whose wavelength is converted by the wavelength-converting materials is mixed with light having passed through the wavelength-converting sheet 220 without colliding with the wavelength-converting materials to produce white light. For example, the light-diffusing sheet 240 may include a light diffusion material 242 such as $TiO_2$ or $SiO_2$ and serves to diffuse and radiate wavelength-converted light. Since the light-transmitting sheet 200 is stacked on and bonded to the top surface of the flexible micro-LED panel 100, it functions to maintain a state in which the side surfaces of a plurality of adjacent flexible circuit boards 120 of the flexible micro-LED panel 100 are attached to each other. It should be understood that the light-transmitting sheet 200 is flexible.

The extended flexible micro-LED panel 100 includes a plurality of rectangular or square flexible circuit boards 120, a plurality of LED chips 140 mounted on the plurality of flexible circuit boards 120 and entirely covered with the light-transmitting sheet 200, and one or more interconnections 160 disposed on the bottom surfaces of the adjacent flexible circuit boards 120 to electrically connect the flexible circuit boards 120. The plurality of flexible circuit boards 120 are arrayed in a matrix along horizontal and vertical directions. Each of the flexible circuit boards 120 is arranged such that its four side surfaces are in contact with the corresponding side surfaces of the adjacent flexible circuit boards 120. With this arrangement, no unwanted gaps are created between the adjacent flexible circuit boards 120 of the extended flexible micro-LED panel 100.

The interconnections 160 connect the LED chips 140 mounted on the adjacent flexible circuit boards 120 in series or series-parallel. For example, a jumper harness may be used for this connection. In this embodiment, the interconnections 160 include 2-way interconnections 162, each of which is provided between the two flexible circuit boards 120 adjacent to each other in a horizontal or vertical direction, and 4-way interconnections 164, each of which is provided at a point where the four adjacent flexible circuit boards 120 meet together. Each of the 2-way interconnections 162 includes only interconnection lines electrically connecting the LED chips 140 mounted on the two flexible circuit boards 120 adjacent to each other in a horizontal or vertical direction. Each of the 4-way interconnections 164 includes interconnection lines electrically connecting the LED chips 140 mounted on the two flexible circuit boards 120 adjacent to each other in a horizontal direction and interconnection lines electrically connecting the LED chips 140 mounted on the two flexible circuit boards 120 adjacent to each other in a vertical direction.

Each of the LED chips 140 may be a micro-LED chip having at least one side whose length is several tens to hundreds of micrometers. Due to the very small size of the LED chips 140 and the flexibility of the flexible circuit boards 120, the extended micro-LED panel 100 including the flexible circuit boards 120 attached to each other and the LED chips 140 mounted on the flexible circuit boards can be deformed to a finer size. Since the unit flexible circuit board 120 and the LED chips 140 mounted on the unit flexible circuit board 120 constitute one LED module, the extended flexible micro-LED panel 100 is considered as a combination of a plurality of LED modules attached to each other.

The LED chips 140 are wireless chips, particularly preferably flip-chip type LED chips mounted in a flip-chip manner on the flexible circuit boards 120 through first conductive electrode pads and second conductive electrode pads. The use of LED chips requiring bonding wires may cause damage to the bonding wires when a light-transmitting sheet is stacked on the LED chips.

As best illustrated in FIG. 12, the first distance D between the two adjacent LED chips 140 on one flexible circuit board 120 and the second distance d between the two adjacent LED chips 140 on the two adjacent circuit boards 120 in a row of the LED chips 140 arrayed in the flexible micro-LED panel satisfy the following relationship:

$$D=(0.9\sim1.1)\times d$$

If the first distance exceeds 1.1 times the second distance, the boundary between the two adjacent flexible circuit boards 120 is excessively dark compared to the other areas. Meanwhile, if the first distance is less than 0.9 times the second distance, the boundary between the two adjacent flexible circuit boards 120 is excessively bright compared to the other areas. Accordingly, both cases are not suitable to obtain uniform surface light.

In this embodiment, the empty spaces between the LED chips 140 are filled with portions of the light-transmitting sheet, particularly compressed portions of the wavelength-converting sheet 220.

The flexible LED lighting device can be fabricated by the following procedure.

First, a large-area light-transmitting sheet 200, more specifically a large-area wavelength-converting sheet 220 and/or a large-area light-diffusing sheet 240, is prepared. Flexible LED modules (i.e. flexible circuit boards 120 mounted with LED chips 140) adapted to the size of the light-transmitting sheet 200 are arranged such that a structure including the plurality of flexible circuit boards 120 arrayed without gaps and the plurality of LED chips 140 mounted on the flexible circuit boards 120 is in contact with the light-transmitting sheet 200. Next, the flexible circuit boards 120 are electrically connected to each other through interconnections 160 such that the LED chips 140 mounted on the different circuit boards are electrically connected to each other in series-parallel. Each of the flexible LED modules including the flexible circuit boards 120 and the LED chips 140 mounted on the flexible circuit boards 120 is designed to be bezel-less for the above-described arrangement and assembly. The bottom surface of each of the flexible circuit board 120 is divided into a positive electrode portion and a negative electrode portion, which is desirable for convenient serial-parallel connection. Thus, it is preferable that the bottom surface of each of the two adjacent flexible circuit boards 120 (i.e. the first flexible circuit board 120 and the second flexible circuit board 120) includes a positive electrode portion and a negative electrode portion and the side surface of the positive electrode portion of the first flexible circuit board 120 is adjacent to the side surface of the negative electrode portion of the second flexible circuit board 120.

FIG. 13 illustrates a flexible LED lighting device according to a further embodiment of the second disclosure.

Referring to FIG. 13, the flexible LED lighting device includes an extended flexible micro-LED panel 100 and a light-transmitting sheet 200 arranged on the extended flexible micro-LED panel 100, as in the previous embodiment. The extended flexible micro-LED panel 100 includes: a plurality of flexible circuit boards 120 whose side surfaces are arrayed in contact with each other without gaps along a horizontal or vertical direction; a plurality of LED chips 140 mounted on the flexible circuit boards and entirely covered with the light-transmitting sheet 200; and an interconnection 160 disposed on the bottom surfaces of the adjacent flexible circuit boards 120 to electrically connect the flexible circuit boards.

The flexible LED lighting device further includes a flexible boundary adhesive part 170 formed along the boundary between the adjacent flexible circuit boards 120. The flexible boundary adhesive part 170 may be a flexible adhesive tape that is long attached to two adjacent edges of the flexible circuit boards 120 along the boundary. Alternatively, the flexible boundary adhesive part 170 may be a flexible sealing material that is long applied to two adjacent edges of the flexible circuit boards 120 along the boundary. The flexible boundary bonding part 170 has flexibility similar to the flexible circuit boards 120, making the flexible micro-LED panel 100 flexible as a whole. In addition, the flexible boundary adhesive part 170 covers at least a portion of the interconnection 160 connecting the adjacent flexible circuit boards 120. The other elements and parts are the same as those of the previous embodiment and their detailed description is thus omitted to avoid duplication.

FIG. 14 illustrates a flexible LED lighting device according to a further embodiment of the second disclosure.

Referring to FIG. 14, the flexible LED lighting device includes an extended flexible micro-LED panel 100 and a light-transmitting sheet 200 arranged on the extended flexible micro-LED panel 100, as in the previous embodiment. The extended flexible micro-LED panel 100 includes: a plurality of flexible circuit boards 120 whose side surfaces are arrayed in contact with each other without gaps along a horizontal or vertical direction; a plurality of LED chips 140 mounted on the flexible circuit boards and entirely covered with the light-transmitting sheet 200; and an interconnection 160 disposed on the bottom surfaces of the adjacent flexible circuit boards 120 to electrically connect the flexible circuit boards. In this embodiment, an underfill 201 is filled between the adjacent LED chips 140. The underfill 201 may be composed of a resin material, more preferably, a resin material including wavelength-converting materials such as phosphors or quantum dots or a resin material including a light-reflecting or light-scattering material. The underfill 201 may have a central recess between the adjacent LED chips 140.

FIG. 15 illustrates the bottom surface of a flexible LED unit of a flexible LED lighting device according to another embodiment of the second disclosure.

Referring to FIG. 15, the flexible LED lighting device includes an extended micro-LED panel 100, as in the previous embodiment. The extended micro-LED panel 100 has a square or rectangular shape and includes a plurality of flexible circuit boards 120 whose side surfaces are arrayed in contact with each other without gaps along horizontal and vertical directions. The flexible circuit boards 120 are electrically connected to each other through interconnections 160. In this embodiment, each of the interconnections 160 includes a flexible interconnection film (e.g., FPCB) or cable 165 having both ends detachably connected to two corresponding connectors 167 provided on the bottom surfaces of the adjacent flexible substrates 120. A flexible boundary adhesive part 170 is long attached to two adjacent edges of the flexible circuit boards 120 along the boundary between the adjacent flexible circuit boards 120. The flexible boundary adhesive part 170 may be a flexible adhesive tape 170.

Although not described in detail in the foregoing embodiments, the flexible LED lighting device may have the following construction.

The layer number and thickness of the flexible substrates may vary depending on the size and pitch of LED chips mounted on the flexible substrates. For example, when micro-LED chips having a width of several tens to hundreds of micrometers, more preferably, a size of 100 μm×300 μm, are arrayed at pitches of approximately 0.8 mm, each of the flexible substrates may have a thickness of approximately 0.15 mm. Alternatively, when the micro-LED chips are arrayed at pitches of approximately 0.6 to 0.8 mm, each of the flexible substrates may have a bilayer stack structure with a thickness of approximately 0.30 mm. Alternatively, when the micro-LED chips are arrayed at pitches of approximately 0.4 to 0.6 mm, each of the flexible substrates may have a trilayer stack structure with a thickness of approximately 0.45 mm Although the reduced pitch of the micro-LED chips ensures uniform surface light, the layer number and thickness of the flexible substrates increase, making it difficult to freely change the curvature of the flexible surface lighting device. Accordingly, the layer number of the flexible substrates is preferably 1 to 3, most preferably 1. As used herein, the term "layer" means an insulating layer formed with a conductive pattern and the term "layer number" means the number of insulating layers.

The LED chips are micro-LED chips having a width of several tens to hundreds of micrometers and are mounted in a matrix on the flexible substrates. Each of the LED chips includes a light-transmitting sapphire substrate, a buffer layer formed under the sapphire substrate, a first conductive semiconductor layer formed under the buffer layer, an active layer formed under the first conductive semiconductor layer, and a second conductive semiconductor layer formed under the active layer. The active layer is interposed between the second conductive semiconductor layer and the first conductive semiconductor layer. Electrons combine with holes in the active layer to emit light. The lower surface of the second conductive semiconductor layer is exposed downward. The second conductive semiconductor layer and the active layer are partially removed such that a portion of the lower surface of the first conductive semiconductor layer is exposed downward. A first conductive electrode pad is disposed on the exposed lower surface of the first conductive conductor layer and extends downward. A second conductive electrode pad having a polarity opposite to that of the first conductive electrode pad is disposed on the lower surface of the second conductive semiconductor layer.

For example, a light-transmitting sheet may include a wavelength-converting sheet and a light-diffusing sheet and may have an entrance surface in contact with the LED chips and an exit surface through which light entering through the entrance surface is emitted to the outside. The light-transmitting sheet functions as a waveguide. The height of the light-transmitting sheet may be relatively large because the height of the LED chips is as very small as several to hundreds of micrometers. With these dimensions, light is sufficiently uniformly diffused in the light-transmitting sheet and the diffused light is emitted from the light-transmitting sheet to the outside. The wavelength of light is converted in the wavelength-converting sheet. The wavelength-converted light is sufficiently mixed with light whose wavelength is not converted in the wavelength-converting sheet and the mixed light is emitted from the wavelength-converting sheet to the outside.

As mentioned above, the light-diffusing sheet constitutes the upper or lower portion of the light-transmitting sheet and is made using a mixture of a flexible light-transmitting resin material as a base material and a particulate diffusion agent uniformly distributed in the resin material. For example, the flexible light-transmitting resin material may be a silicone resin and the diffusion agent may be $TiO_2$, $SiO_2$ or a mixture thereof. A plurality of silver nanoparticles may be added to the light-transmitting sheet, particularly a portion of the light-transmitting sheet located in contact with the LED chips. In this case, the silver nanoparticles migrate to the Cu-containing first and second conductive electrode pads of the LED chips under heat (~150° C.) and pressure to form nano-silver clusters. The nano-silver clusters can reinforce the bonding between the first and second conductive electrode pads and solders and can prevent the formation of cracks.

[Third Disclosure]

A third disclosure will be described with reference only to FIGS. 16 to 23.

FIG. 16 is a perspective view illustrating a flexible LED lighting device according to one embodiment of a third disclosure, FIG. 17 is an exploded perspective view illustrating the flexible LED lighting device, FIG. 18 is an exploded perspective view illustrating an extended flexible micro-LED panel of the flexible LED lighting device, FIG.

19 is a plan view illustrating the extended flexible micro-LED panel of FIG. 18, and FIG. 20 illustrates (a) a cross-sectional view taken along line A-A of FIG. 19 and (b) a cross-sectional view taken along line B-B of FIG. 19.

Referring to FIGS. 16 to 20, the flexible LED lighting device includes an extended flexible micro-LED panel 100 and a light-transmitting film 200 arranged on the extended flexible micro-LED panel 100. The flexible LED lighting device is a surface lighting device that can be deformed into various shapes.

The light-transmitting film 200 receives light emitted from the extended flexible micro-LED panel 100 through the bottom surface thereof and radiates the received light to the outside through the top surface thereof. The light-transmitting film 200 may be in the form of a monolayer film but preferably has a structure in which two or more films with various functions are laminated on each other. The one or more constituent layers of the light-transmitting film 200 may be attached to the extended micro-LED panel 100 or may be formed on the extended micro-LED panel 100 by molding.

In this embodiment, the light-transmitting film 200 is stacked in direct contact with the top surface of the extended flexible micro-LED panel 100 and includes a wavelength-converting sheet 220 converting the wavelength of light emitted from the extended flexible micro-LED panel 100 and a light-diffusing sheet 240 diffusing light passing through the wavelength-converting sheet 220 and emitting the diffused light to the outside.

The wavelength-converting sheet 220 is made by mixing wavelength-converting materials 222 such as phosphors or quantum dots with a transparent resin and molding the mixture. Light whose wavelength is converted by the wavelength-converting materials is mixed with light having passed through the wavelength-converting sheet 220 without colliding with the wavelength-converting materials to produce white light. For example, the light-diffusing sheet 240 may include a light diffusion material 242 such as $TiO_2$ or $SiO_2$ and serves to diffuse and radiate wavelength-converted light. Since the light-transmitting film 200 is stacked on and bonded to the top surface of the flexible micro-LED panel 100, it functions to maintain a state in which the edges of a plurality of adjacent flexible circuit boards 120 of the flexible micro-LED panel 100 overlap and are attached to each other. It should be understood that the light-transmitting film 200 is flexible.

The extended flexible micro-LED panel 100 includes a plurality of rectangular or square flexible circuit boards 120 whose edges partially overlap each other vertically and are attached to each other in horizontal and vertical directions, a plurality of LED chips 140 mounted on the plurality of flexible circuit boards 120 and entirely covered with the light-transmitting film 200, and one or more interconnections 160 interposed between the overlapping edges of the adjacent flexible circuit boards 120 to electrically connect the flexible circuit boards 120.

As mentioned above, the plurality of flexible circuit boards 120 are arrayed in a matrix along horizontal and vertical directions. Each of the flexible circuit boards 120 is arranged such that the edges around its four sides and the corresponding edges of the adjacent flexible circuit board 120 are superimposed on and overlap each other. With this arrangement, no unwanted gaps are created between the adjacent flexible circuit boards 120 of the extended flexible micro-LED panel 100.

In this embodiment, each of the flexible circuit boards 120 includes a first stepped portion 122 and a second stepped portion 124 at two opposite ones of the edges where it overlaps the other adjacent flexible circuit boards 120. The first stepped portion 122 is recessed to a predetermined depth from the top surface of the flexible circuit board 120 at one edge of the flexible circuit board 120 and is stepped relative to the top surface of the flexible circuit board 120. The second stepped portion 124 is recessed to a predetermined depth from the bottom surface of the flexible circuit board 120 at another edge opposite to the one edge of the flexible circuit board 120 and is stepped relative to the bottom surface of the flexible circuit board 120. In this embodiment, each of the flexible circuit boards 120 is substantially quadrangular having four edges and overlaps and is attached to four other flexible circuit boards 120 at the four edges. Accordingly, each of the circuit boards 120 has first stepped portions 122 formed at two edges crossing each other at right angles and second stepped portions 124 formed at right angles at edges opposite to the edges where the first stepped portions 122 are formed.

The first stepped portion 122 of each of the flexible circuit board 120 is arranged at one edge of the flexible circuit board 120 such that its top surface faces the bottom surface of the second stepped portion 124 of the adjacent flexible circuit board 120. An interconnection 160 is disposed between the first stepped portion 122 and the second stepped portion 124 to electrically connect the two adjacent flexible circuit boards 120. The interconnection 160 may include a first connection portion 160a formed on the first stepped part 122 and a second connection portion 160b formed on the second stepped part 124. The interconnection 160 connects the LED chips 140 mounted on the adjacent flexible circuit boards 120 in series or series-parallel.

In the present embodiment, the interconnections 160 include an interconnection 160 provided on an area where the edges of the two flexible circuit boards 120 adjacent to each other in the horizontal direction overlap and an interconnection 160 provided on an area where the edges of the two flexible circuit boards 120 adjacent to each other in the vertical direction overlap. In each of the overlapping areas, the first stepped portion 122 formed at one edge of the flexible circuit board 120 overlaps the second stepped portion 124 formed at the other edge of the adjacent flexible circuit board 120. The interconnection 160 is provided between the first stepped portion 122 and the second stepped portion 124.

Each of the LED chips 140 may be a micro-LED chip having at least one side whose length is several tens to hundreds of micrometers. Due to the very small size of the LED chips 140 and the flexibility of the flexible circuit boards 120, the extended micro-LED panel 100, which includes an extended flexible circuit board consisting of the flexible circuit boards 120 whose edges overlap and are attached to each other and the LED chips 140 mounted on the extended flexible circuit board, can be deformed to a finer size. The wavelength-converting sheet 220 is disposed so as to cover the top surfaces of the flexible circuit boards 120 mounted with the LED chips 140 except for the areas where the first stepped portions 122 are formed.

Since the unit flexible circuit board 120 and the LED chips 140 mounted on the unit flexible circuit board 120 constitute one LED module, the extended flexible micro-LED panel 100 is considered as a combination of a plurality of LED modules attached to each other. The areas where the first and second stepped portions 122 and 124 of the flexible circuit boards 120 overlap are as flexible as the other areas of the flexible circuit boards 120, which is advantageous in deforming the final flexible LED lighting device into a desired shape.

The LED chips 140 are wireless chips, particularly preferably flip-chip type LED chips mounted in a flip-chip manner on the flexible circuit boards 120 through first conductive electrode pads and second conductive electrode pads. The use of LED chips requiring bonding wires may cause damage to the bonding wires when a light-transmitting film is stacked on the LED chips.

As best illustrated in FIG. 19, the first distance D between the two adjacent LED chips 140 on one flexible circuit board 120 and the second distance d between the two adjacent LED chips 140 on the two adjacent circuit boards 120 in a row of the LED chips 140 arrayed in the flexible micro-LED panel satisfy the following relationship:

$$D=(0.9\sim1.1)\times d$$

If the first distance exceeds 1.1 times the second distance, the boundary between the two adjacent flexible circuit boards 120 is excessively dark compared to the other areas. Meanwhile, if the first distance is less than 0.9 times the second distance, the boundary between the two adjacent flexible circuit boards 120 is excessively bright compared to the other areas. Accordingly, both cases are not suitable to obtain uniform surface light.

The flexible LED lighting device can be fabricated by the following procedure.

First, a large-area light-transmitting film 200, more specifically a large-area wavelength-converting sheet 220 and/or a large-area light-diffusing sheet 240, is prepared. Flexible LED modules adapted to the size of the light-transmitting film 200 are arranged in contact with the light-transmitting film 200, particularly the bottom surface of the wavelength-converting sheet 220. Alternatively, a flexible micro-LED panel 100 including flexible LED modules 100' connected to each other is first prepared and a large-area wavelength-converting sheet 220 and a large-area light-diffusing sheet 240 are sequentially arranged on the top surface of the flexible micro-LED panel 100. The flexible LED modules 100' are connected to each other such that their edges overlap. Interconnections (160a, 160b; 160) are provided between first stepped portions 122 of flexible circuit boards 120 and second stepped portions 124 of adjacent flexible circuit boards 120 to electrically connect the flexible circuit boards 120 to each other.

As a result, a structure including the plurality of flexible circuit boards 120 arrayed without gaps and the plurality of LED chips 140 mounted on the flexible circuit boards 120 can be arranged in contact with the light-transmitting film 200. The use of the interconnections previously disposed at the edges of the flexible circuit boards 120 avoids the need for additional means to electrically connect the flexible circuit boards 120 on the bottom surfaces of the flexible circuit boards 120.

One of the flexible circuit boards is defined as a first flexible circuit board 120, and four adjacent flexible circuit boards overlapping four edges of the first flexible circuit board 120 are defined as second, third, and fourth flexible circuit boards.

Here, the first flexible circuit board 120 includes first and second edges located opposite to each other wherein the first edge has a first stepped portion 122 recessed to a predetermined depth from the top surface of the first flexible circuit board 120 and the second edge has a second stepped portion 124 recessed to a predetermined depth from the bottom surface of the first flexible circuit board 120. A first interconnection is located between the top surface of the first edge of the first flexible circuit board 120 where the first stepped part 122 is formed and the bottom surface of an edge of the second flexible circuit board 120 where a second stepped part is formed. A second interconnection is located between the bottom surface of the second edge of the first flexible circuit board 120 where the second stepped part 124 is formed and the top surface of an edge of the third flexible circuit board 120 where a first stepped part is formed. The first flexible circuit board 120 includes a third edge orthogonal to the first edge and a fourth edge located opposite to the third edge wherein a third interconnection is disposed between the top surface of the third edge of the first flexible circuit board 120 and the bottom surface of the corresponding edge of the fourth flexible circuit board and a fourth interconnection is disposed between the bottom surface of the fourth edge of the first flexible circuit board 120 and the top surface of the corresponding edge of the fifth flexible circuit board. When a first stepped portion 122 is provided at the third edge of the first flexible circuit board 120, a second stepped portion 124 is provided at the fourth edge opposite to the third edge.

FIG. 21 illustrates a flexible LED lighting device according to a further embodiment of the third disclosure.

Referring to FIG. 21, the flexible LED lighting device includes an extended flexible micro-LED panel 100 and a light-transmitting film arranged on the extended flexible micro-LED panel, as in the previous embodiment. The extended flexible micro-LED panel 100 includes a plurality of flexible circuit boards 120 whose edges overlap, a plurality of LED chips 140 mounted on the flexible circuit boards and entirely covered with the light-transmitting film 200, and an interconnection 160 electrically connecting the flexible circuit boards 120 in an area where the flexible circuit boards 120 overlap. The light-transmitting film includes a plurality of wavelength-converting sheets 220' and a light-diffusing sheet 240. Each of the plurality of unit wavelength-converting sheets 220' is disposed on the corresponding flexible circuit board 120 to cover the LED chips 140 mounted on the flexible circuit board 120, unlike in the previous embodiment in which one wavelength-converting sheet is arranged so as to cover an extended flexible micro-LED panel 100 including a plurality of LED modules connected to each other. Here, the wavelength-converting sheets 220' are not disposed on first stepped portions 122 formed at the edges of the flexible circuit board 120 that overlap the other flexible circuit boards 120. The wavelength-converting sheets 220' are combined into one large-area wavelength-converting sheet, which is covered with the large-area light-diffusing sheet 240. The large-area light-diffusing sheet can be considered to consist of a plurality of unit light-diffusing sheets.

FIG. 22 is an exploded cross-sectional view illustrating a flexible LED lighting device according to another embodiment of the third disclosure and FIG. 23 is a cross-sectional view of the flexible LED lighting device of FIG. 22.

Referring to FIGS. 22 and 23, the flexible LED lighting device includes an extended flexible micro-LED panel 100 and a light-transmitting film arranged on the extended flexible micro-LED panel, as in the previous embodiment. The extended flexible micro-LED panel 100 includes a plurality of flexible circuit boards 120 whose edges overlap, a plurality of LED chips 140 mounted on the flexible circuit boards and entirely covered with the light-transmitting film, and interconnections (160a, 160b; 160) electrically connecting the flexible circuit boards 120 in areas where the flexible circuit boards 120 overlap. The light-transmitting film includes a plurality of wavelength-converting sheets 220' and a light-diffusing sheet 240. Each of the plurality of unit wavelength-converting sheets 220' is disposed on the corresponding flexible circuit board 120 to cover the LED chips 140 mounted on the flexible circuit board 120. Here, the wavelength-converting sheets 220' are not disposed on the edges of the flexible circuit board 120 that overlap the other flexible circuit boards 120. The wavelength-converting sheets 220' are combined into one large-area wavelength-converting sheet, which is covered with the large-area light-diffusing sheet 240. The large-area light-diffusing sheet can be considered to consist of a plurality of unit light-diffusing sheets. The edges adjacent to the sides of the flexible circuit board 120 are in the same plane as the remaining area of the flexible circuit board 120 (i.e. the area where the LED chips are mounted), unlike in the previous embodiment where stepped portions are formed at edges of flexible circuit boards 120. That is, the area of the flexible circuit board 120 on which the LED chips are mounted and the wavelength-converting sheet is disposed has the same thickness as the area where the interconnections are formed.

One edge of the flexible circuit board 120 is superimposed on and overlaps the corresponding edge of the adjacent flexible circuit board 120. In the overlapping area, the first connection portion 160a and the second connection portion 160b meet each other to form the interconnection 160 through which the LED chips 140 mounted on the flexible circuit boards 120 are connected in series or series-parallel. Since the interconnections 160 are formed at all edges of the four sides of each of the flexible circuit boards 120, the LED chips mounted on the flexible circuit boards 120 can be electrically connected to each other in both horizontal and vertical directions.

The wavelength-converting sheet is in contact with not only the top surfaces but also the side surfaces of the LED chips in each of the foregoing embodiments. Alternatively, the wavelength-converting sheet may be arranged or disposed in contact with only the top surfaces of the LED chips. In this case, an underfill material may be filled between the adjacent LED chips to cover the side surfaces of the LED chips. Preferably, the underfill material includes a resin. For example, the underfill material may be a mixture of a resin and wavelength-converting materials. Phosphors or quantum dots may be used as the wavelength-converting materials. For example, light whose wavelength is converted by the wavelength-converting materials may be mixed with light having passed through the wavelength-converting sheet without colliding with the wavelength-converting materials to produce white light.

Although not described in detail in the foregoing embodiments, the flexible LED lighting device may have the following constitution.

The layer number and thickness of the flexible substrates may vary depending on the size and pitch of LED chips mounted on the flexible substrates. For example, when micro-LED chips having a width of several tens to hundreds of micrometers, more preferably, a size of 100 μm×300 μm, are arrayed at pitches of approximately 0.8 mm, each of the flexible substrates may have a thickness of approximately 0.15 mm. Alternatively, when the micro-LED chips are arrayed at pitches of approximately 0.6 to 0.8 mm, each of the flexible substrates may have a bilayer stack structure with a thickness of approximately 0.30 mm. Alternatively, when the micro-LED chips are arrayed at pitches of approximately 0.4 to 0.6 mm, each of the flexible substrates may have a trilayer stack structure with a thickness of approximately 0.45 mm Although the reduced pitch of the micro-LED chips ensures uniform surface light, the layer number and thickness of the flexible substrates increase, making it difficult to freely change the curvature of the flexible surface lighting device. Accordingly, the layer number of the flexible substrates is preferably 1 to 3, most preferably 1. As used herein, the term "layer" means an insulating layer formed with a conductive pattern and the term "layer number" means the number of insulating layers.

The LED chips are micro-LED chips having a width of several tens to hundreds of micrometers and are mounted in a matrix on the flexible substrates. Each of the LED chips includes a light-transmitting sapphire substrate, a buffer layer formed under the sapphire substrate, a first conductive semiconductor layer formed under the buffer layer, an active layer formed under the first conductive semiconductor layer, and a second conductive semiconductor layer formed under the active layer. The active layer is interposed between the second conductive semiconductor layer and the first conductive semiconductor layer. Electrons combine with holes in the active layer to emit light. The lower surface of the second conductive semiconductor layer is exposed downward. The second conductive semiconductor layer and the active layer are partially removed such that a portion of the lower surface of the first conductive semiconductor layer is exposed downward. A first conductive electrode pad is disposed on the exposed lower surface of the first conductive conductor layer and extends downward. A second conductive electrode pad having a polarity opposite to that of the first conductive electrode pad is disposed on the lower surface of the second conductive semiconductor layer.

For example, a light-transmitting film may include a wavelength-converting sheet and a light-diffusing sheet and may have an entrance surface in contact with the LED chips and an exit surface through which light entering through the entrance surface is emitted to the outside. The light-transmitting film functions as a waveguide. The height of the light-transmitting film may be relatively large because the height of the LED chips is as very small as several to hundreds of micrometers. With these dimensions, light is sufficiently uniformly diffused in the light-transmitting film and the diffused light is emitted from the light-transmitting film to the outside. The wavelength of light is converted in the wavelength-converting sheet. The wavelength-converted light is sufficiently mixed with light whose wavelength is not converted in the wavelength-converting sheet and the mixed light is emitted from the wavelength-converting sheet to the outside.

As mentioned above, the light-diffusing sheet constitutes the upper or lower portion of the light-transmitting film and is made using a mixture of a flexible light-transmitting resin material as a base material and a particulate diffusion agent uniformly distributed in the resin material. For example, the flexible light-transmitting resin material may be a silicone resin and the diffusion agent may be $TiO_2$, $SiO_2$ or a mixture thereof. A plurality of silver nanoparticles may be added to the light-transmitting film, particularly a portion of the light-transmitting film located in contact with the LED chips. In this case, the silver nanoparticles migrate to the Cu-containing first and second conductive electrode pads of the LED chips under heat (~150° C.) and pressure to form nano-silver clusters. The nano-silver clusters can reinforce the bonding between the first and second conductive electrode pads and solders and can prevent the formation of cracks.

[Fourth Disclosure]

A fourth disclosure will be described with reference only to FIGS. 24 to 29.

FIG. 24 is a perspective view illustrating a state in which a light-transmitting film is separated from a micro-LED display panel according to one embodiment of a fourth disclosure and FIG. 25 is a perspective view illustrating a state in which the light-transmitting film is attached to the micro-LED display panel.

Referring to FIGS. 24 and 25, the micro-LED display panel includes: a plurality of micro-LED modules 100 whose side surfaces are attached to each other and which are arrayed in a matrix; and a light-transmitting film 300 entirely covering the top surfaces of the micro-LED modules 100. The light-transmitting film 300 is a flexible film that performs a specific function. In this embodiment, the light-transmitting film 300 includes an antiglare film. The display panel may further include a support frame 200 that is used to support the micro-LED modules 100 arrayed in a matrix thereon. Although not illustrated, the LED display panel may further include structures fixing the micro-LED modules 100 to the support frame 200. The micro-LED display panel may further include an interface board and a power supply.

Each of the plurality of micro-LED modules 100 includes a rectangular mount substrate 110 and a plurality of LED pixels 120 arrayed in a matrix on the top surface of the mount substrate 110. Each of the plurality of LED pixels 120 includes three LED chips mounted on the top surface of the mount substrate 110 in a flip-chip bonding manner. The three LED chips are a first micro-LED chip 120R emitting red light, a second micro-LED chip 120G emitting green light, and a third micro-LED chip 120B emitting blue light. Each of the micro-LED chips 120R, 120G, and 120B is preferably a semiconductor chip in which an electrode pad is directly bonded to an electrode disposed on a mount substrate without being accommodated in a separate package having a lead frame or a lead terminal. Each of the first, second, and third micro-LED chips 120R, 120G, and 120B is preferably a flip-chip type LED chip in which both first and second conductive electrodes are provided to face the mount substrate. In this case, there is no need to dispose bonding wires and electrodes on the light-emitting surfaces of the micro-LED chips to which the light-transmitting film 300 is attached, enabling complete face-to-face contact between the light-transmitting film 300 and the first, second, and third micro-LED chips 120R, 120G, and 120B.

The plurality of planar micro-LED modules 100 whose side surfaces are attached to each other are arrayed in a matrix. With this array, the micro-LED modules 100 are combined into the display panel. Driver IC devices may be provided on the bottom surfaces of the mount substrate 110 to operate the micro-LEDs. The matrix array of the plurality of planar micro-LED modules 100 whose side surfaces are attached leads to the formation of horizontal gap lines CL and vertical gap lines VL crossing the horizontal gap lines at right angles. The horizontal gap lines CL and the vertical gap lines VL are formed by very small linear gaps between the planar micro-LED modules 100 adjacent to each other in the vertical direction and very small linear gaps between the planar micro-LED modules 100 adjacent to each other in the horizontal direction, respectively.

As mentioned above, the LED display panel includes one flexible light-transmitting film 300 arranged in contact with the top surfaces of the micro-LED modules 100 arrayed in a matrix. The light-transmitting film 300 may have a thickness of about 300 to 400 nm and may include an antiglare (AG) film 320 having a thickness of about 100 nm (see FIGS. 26 to 29) and an adhesive layer 340 having a thickness of 200 to 300 nm (see FIGS. 26 to 29). The adhesive layer 340 (see FIGS. 26 to 29) can be melted by heat applied during an autoclave process, which will be described below. When the light-transmitting film 300 is arranged in contact with the top surfaces of the plurality of micro-LED modules 100, air remains between the LED modules 100 and the light-transmitting film 300 due to the horizontal gap lines CL and the vertical gap lines VL. In this embodiment, the light-transmitting film 300 includes a plurality of air holes through which the residual air between the micro-LED modules 100 and the light-transmitting film 300 is removed. The plurality of air holes include a plurality of first air holes 301 formed in the light-transmitting film 300 along the horizontal gap lines CL and a plurality of second air holes 303 formed in the light-transmitting film 300 along the vertical gap lines VL. The light-transmitting film 300 further includes third air holes 305 formed at points of intersection of the horizontal gap lines CL and the vertical gap lines VL. By air suction through the first air holes 301, the second air holes 303, and optionally, the first third air holes 303, the light-transmitting film 300 is brought into close contact with the top surfaces of the micro-LED modules 100 and residual air between the light-transmitting film 300 and the micro-LED modules 100 is removed.

Each of the micro-LED modules 100 further includes a resin layer 140 formed on the top surface of the mount substrate to cover the side surfaces of all micro-LED chips (including the first micro-LED chips 120R, the second micro-LED chips 120G, and the third micro-LED chips 120B) mounted on the mount substrate. Here, the front surface of the resin layer 140 may lie in the same plane as the light-emitting surfaces of the micro-LED chips 120R, 120G, and 120B. Thus, the light-transmitting film 300 can be brought into close face-to-face contact with the front surfaces of the micro-LEDs 100 and the resin layer 140 in all areas except the gap lines CL and VL (collectively denoted by L) when air is suctioned through the air holes 301, 302, and 303. The resin layer 140 may be formed using a mixture of a resin and a reflective material. In this case, the resin layer 140 serves as a reflective wall. For example, the resin may be a silicone resin and the reflective material may be particulate $TiO_2$ or $SiO_2$. The surface of the resin layer 140 lies in the same plane as the light-emitting surfaces of the micro-LED chips 120R, 120G, and 120B. This arrangement offers the advantage that the resin layer 140 comes into close contact with the light-transmitting film 300 without leaving air. However, it is noted that the resin layer 140 may be omitted. The resin layer 140 has inclined faces 142 at edges thereof. The inclined faces 142 of the two adjacent resin layers 140 meet each other to form an air gap line L having a substantially V-shaped cross section between the adjacent micro-LED modules 100.

A method for manufacturing a micro-LED display panel according to one embodiment of the fourth disclosure will now be described.

First, a plurality of planar micro-LED modules 100 are attached to each other on their sides such that they are arrayed in a matrix form, as illustrated in (a) and (b) of FIG. 26. As a result, a plurality of gap lines L, including horizontal gap lines CL and vertical gap lines VL, are formed between the adjacent planar micro-LED modules 100. Although not illustrated, a support frame may be used to fix the planar micro-LED modules 100 arrayed in a matrix. As mentioned above, each of the micro-LED modules 100 includes a mount substrate 110, a plurality of micro-LED chips 120R, 120G, and 120B mounted on the mount substrate 110, and a resin layer 140 filled between the micro-LED chips 120R, 120G, and 120B. The gap lines L formed between the adjacent micro-LED modules 100 have a V-shaped cross section due to inclined faces 142 of the resin layer 140.

Next, a light-transmitting film 300 is arranged in contact with the top surfaces of the plurality of planar micro-LED modules 100, as illustrated in (a) and (b) of FIG. 27. The light-transmitting film 300 may have a thickness of about 300 to 400 nm and may include an antiglare film 320 having a thickness of about 100 nm and an adhesive layer 340 having a thickness of 200 to 300 nm. In this state, air remains in the gap lines L (including, the horizontal gap lines CL and the vertical gap lines VL) between the planar micro-LED modules 100.

Next, air holes H are formed in the light-transmitting film 300 along the gap lines L (including the horizontal gap lines CL and the vertical gap lines VL), as illustrated in (a) and (b) of FIG. 28. The air holes H include first air holes 301 formed along the horizontal gap lines CL, second air holes 303 formed along the vertical gap lines VL, and third air holes 305 formed at points of intersection of the horizontal gap lines CL and the vertical lines VL. The holes H may be formed by processing with a needle 2. Alternatively, the air holes may be formed using a laser. The widths or diameters of the air holes may be approximately 10 to 30 µm.

Next, as illustrated in FIG. 29, the panel in which the light-transmitting film 300 is arranged on the top surfaces of the LED modules 100 is placed in an autoclave 3. Then, an autoclave process is carried out at a temperature of approximately 50° C. to release air remaining in the gap lines L formed by the inclined faces 142 of the adjacent resin layers 140 through the air holes H. The heating to a temperature of 50° C. makes the adhesive layer 340 of the light-transmitting film 300 flowable. The flowable adhesive layer 340 fills the gap lines L and blocks the air holes. A portion of the molten adhesive layer 340 filled in the gap lines L is herein referred to as a sink portion, which is denoted by reference numeral 342.

In the description of the above embodiments, air holes are formed in the light-transmitting film arranged on the top surfaces of the planar micro-LED modules. Alternatively, air holes may be previously formed in the light-transmitting film before the light-transmitting film is arranged in contact with the top surfaces of the planar micro-LED modules.

The invention claimed is:

1. A micro-LED display panel comprising: a first micro-LED module comprising a first mount substrate, a plurality of micro-LED pixels arrayed in a matrix on the top surface of the first mount substrate, and a resin layer formed on the first mount substrate and having inclined faces at edges thereof; a second micro-LED module comprising a second mount substrate, a plurality of micro-LED pixels arrayed in a matrix on the top surface of the second mount substrate, and a resin layer formed on the second mount substrate and having inclined faces at edges thereof and arranged adjacent to at least one side surface of the first micro-LED module to form a horizontal or vertical gap at the boundary with the first micro-LED module; and a light-transmitting film covering the top surfaces of the first micro-LED module and the second micro-LED module, wherein the light-transmitting film comprises first air holes formed along the horizontal gap and second air holes formed along the vertical gap and wherein a sink portion is formed corresponding to each of the first and second air holes and in contact with the inclined faces of the resin layers between the first micro-LED module and the second micro-LED module.

2. The micro-LED display panel according to claim 1, wherein the light-transmitting film comprises an antiglare film and an adhesive layer.

3. The micro-LED display panel according to claim 2, wherein the sink portion is formed from the adhesive layer.

4. The micro-LED display panel according to claim 1, wherein the light-transmitting film is brought into close contact with the surfaces and the inclined faces of the resin layers when air is suctioned through the first air holes and the second air holes.

5. The micro-LED display panel according to claim 1, wherein the light-transmitting film is brought into close contact with the top surfaces of the first micro-LED module and the second micro-LED module when air is suctioned through the first air holes and the second air holes.

6. The micro-LED display panel according to claim 1, wherein the light-transmitting film comprises a third air hole formed at a point of intersection of the horizontal gap line and the vertical gap line.

7. The micro-LED display panel according to claim 1, wherein each of the LED pixels comprises a first micro-LED chip emitting red light, a second micro-LED chip emitting green light, and a third micro-LED chip emitting blue light.

8. The micro-LED display panel according to claim 1, wherein each of the resin layers is formed using a mixture of a resin and a reflective material.

9. A method for manufacturing a micro-LED display panel, comprising: preparing a plurality of micro-LED modules, each of which comprising a mount substrate and a plurality of micro-LED chips arrayed in a matrix on the mount substrate; attaching the side surfaces of the adjacent micro-LED modules such that horizontal gap lines and vertical gap lines are formed; and arranging a light-transmitting film such that it is in contact with the top surfaces of the plurality of micro-LED modules, wherein the light-transmitting film comprises first air holes formed along the horizontal gap lines and second air holes formed along the vertical gap lines.

10. The method according to claim 9, further comprising removing air between the light-transmitting film and the micro-LED modules by air suction through the first air holes and the second air holes.

11. The method according to claim 10, wherein an autoclave process is used to remove air between the light-transmitting film and the micro-LED modules.

12. The method according to claim 9, wherein the preparation of the plurality of micro-LED modules comprises forming a resin layer on the top surface of each of the mount substrates to cover the side surfaces of the plurality of micro-LED chips arrayed on the mount substrate.

13. The method according to claim 12, wherein an inclined face is formed adjacent to a top edge of a side surface of each of the mount substrates at an edge of the corresponding resin layer in the preparation of the plurality of micro-LED modules.

14. The method according to claim 12, wherein when air between the light-transmitting film and the micro-LED modules is removed by air suction through the first air holes and the second air holes, the light-transmitting film is brought into close contact with the surfaces of the resin layers.

15. The method according to claim 13, wherein when air between the light-transmitting film and the micro-LED modules is removed by air suction through the first air holes and the second air holes, a sink portion is formed in contact with the inclined faces of the resin layers.

16. The method according to claim 12, wherein the resin layer is formed using a mixture of a resin and a reflective material.

17. The method according to claim 9, wherein the first air holes and the second air holes are formed by processing with a laser or needle.

18. The method according to claim 17, wherein the holes are formed after the light-transmitting film is arranged.

19. The method according to claim 17, wherein the holes are formed before the light-transmitting film is arranged.

20. The method according to claim 9, wherein the light-transmitting film comprises an antiglare film and an adhesive layer.

* * * * *